United States Patent
Kasukabe et al.

(10) Patent No.: US 7,049,837 B2
(45) Date of Patent: May 23, 2006

(54) PROBE SHEET, PROBE CARD, SEMICONDUCTOR TEST EQUIPMENT AND SEMICONDUCTOR DEVICE FABRICATION METHOD

(75) Inventors: Susumu Kasukabe, Yokohama (JP); Takehiko Hasebe, Yokohama (JP); Yasunori Narizuka, Hiratsuka (JP); Akio Hasebe, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/676,609

(22) Filed: Oct. 2, 2003

(65) Prior Publication Data
US 2004/0070413 A1    Apr. 15, 2004

(30) Foreign Application Priority Data
Oct. 2, 2002    (JP) ............................. 2002-289377

(51) Int. Cl.
*G01R 31/02*    (2006.01)

(52) U.S. Cl. ..................... 324/754; 324/758; 324/761

(58) Field of Classification Search ........ 324/754–758, 324/760–762, 765; 439/482, 912

See application file for complete search history.

(56) References Cited

U.S. PATENT DOCUMENTS

| | | | |
|---|---|---|---|
| 5,321,453 A * | 6/1994 | Mori et al. | 324/754 |
| 6,025,729 A | 2/2000 | Van Loan et al. | |
| 6,028,437 A * | 2/2000 | Potter | 324/757 |
| 6,111,421 A | 8/2000 | Takahashi et al. | |
| 6,215,321 B1 * | 4/2001 | Nakata | 324/754 |
| 6,586,955 B1 * | 7/2003 | Fjelstad et al. | 324/754 |
| 6,614,246 B1 * | 9/2003 | Kohno et al. | 324/754 |
| 6,784,681 B1 * | 8/2004 | Fujimoto et al. | 324/765 |
| 6,799,976 B1 * | 10/2004 | Mok et al. | 439/55 |
| 2002/0053917 A1 | 5/2002 | Tanioka et al. | |

FOREIGN PATENT DOCUMENTS

| | | |
|---|---|---|
| JP | A-64-71141 | 3/1989 |
| JP | A-7-283280 | 10/1995 |
| JP | A-8-50146 | 2/1996 |
| JP | A-8-201427 | 8/1996 |
| JP | A-2000-105264 | 4/2000 |
| WO | 97/43653 | 11/1997 |
| WO | WO 98/04927 | 2/1998 |

* cited by examiner

*Primary Examiner*—Minh N. Tang
(74) *Attorney, Agent, or Firm*—Antonelli, Terry, Stout and Kraus, LLP.

(57) ABSTRACT

A probe card has first contact terminals electrically connected to the fine-pitch electrodes of a test target; wirings drawn from the first contact terminals; and second contact terminals electrically connected to the wirings, wherein the first contact terminals are formed each using an anisotropically etched hole in a crystalline substrate, and a semiconductor device test method (fabrication method) using the probe card.

26 Claims, 22 Drawing Sheets

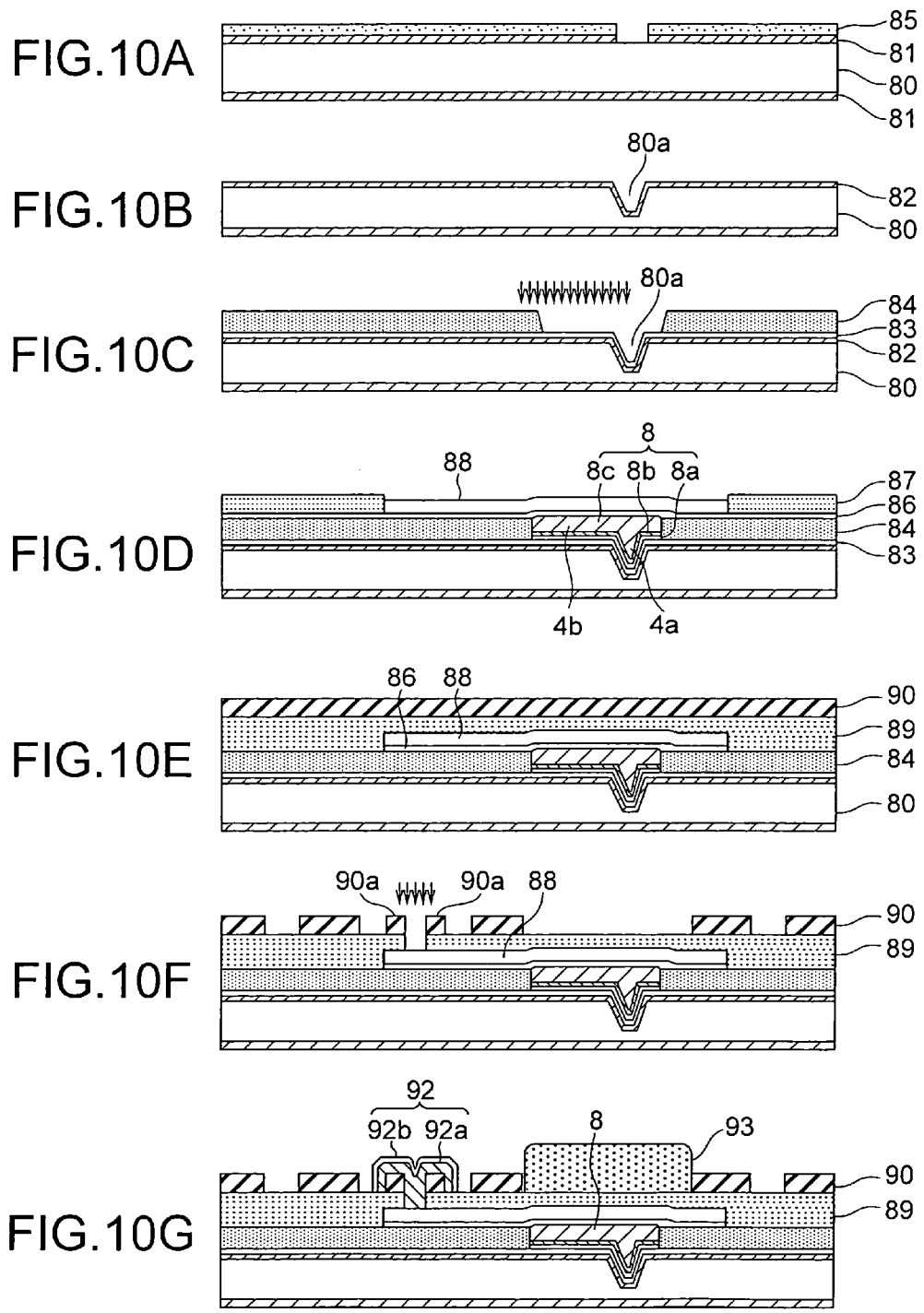

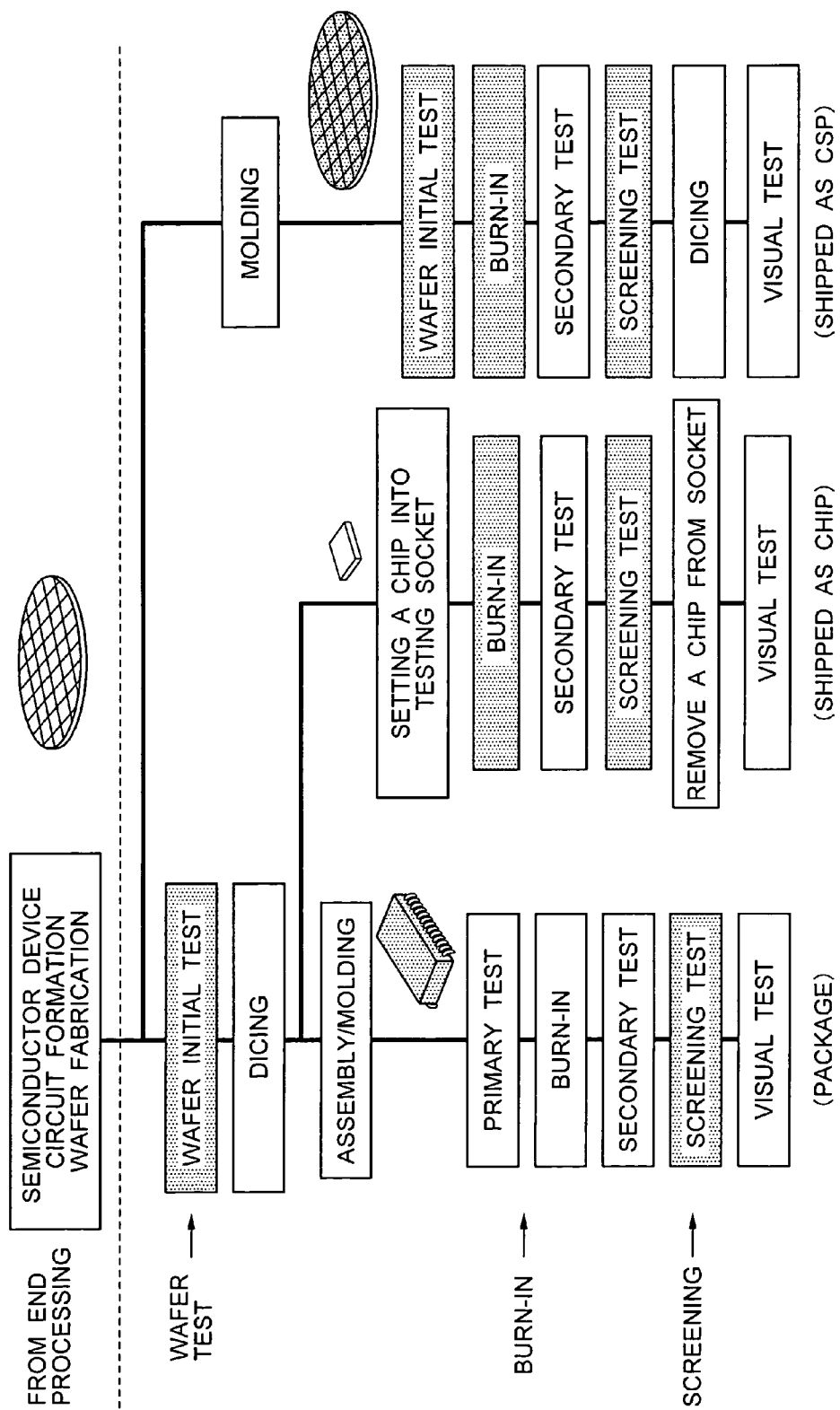

Al pad

Au BUMP

PROBE SHEET, PROBE CARD, SEMICONDUCTOR TEST EQUIPMENT AND SEMICONDUCTOR DEVICE FABRICATION METHOD

BACKGROUND OF THE INVENTION

The present invention relates to a probe card, semiconductor test equipment, and a semiconductor device fabrication method.

FIG. 21 shows an example of the flow of the semiconductor test process, which is one of semiconductor device fabrication processes performed after forming semiconductor device on a wafer. In the figure, packaging LSIs bear chips, and CSPs (Chip Scale Package) are shown as examples of semiconductor devices as a shipping form.

Three main tests are made in the semiconductor device fabrication process as shown in FIG. 21. First, with semiconductor device circuits and electrodes formed on a wafer, a wafer test is made to check test the semiconductor device by open-short test and functional test. Next, a burn-in is made by testing semiconductor devices in a high-temperature or on high-voltage to find unstable semiconductor devices. Finally, a screening test is made to check the product performance before semiconductor devices are shipped.

Equipment used for testing semiconductor devices (semiconductor test equipment) in the prior art is disclosed in JP-A-64-71141 (hereinafter called patent document 1). This prior art equipment uses a spring probe having pins (moving pins) at both ends. That is, an electrical connection is made for testing by bringing the moving pins at one end of the spring probe into contact with the electrodes of a test object (for example, semiconductor device on a wafer) and by bringing the moving pins at the other end brought into contact with the terminals on the substrate in the measuring circuit side.

Another prior art is disclosed in JP-A-8-50146 (hereinafter called patent document 2). In this prior art, a test is made by making an electrical connection for testing by bringing contact terminals into contact with the electrodes of a test object, wherein each contact terminal is formed by using a tip as the cast that is formed by silicon anisotropic etching.

SUMMARY OF THE INVENTION

The prior art described in patent document 1 described above has the problem that, because the contact terminals have a mechanical structure (a spring probe having moving pins), this prior art cannot be applied to fine-pitch electrodes of a semiconductor device.

By contrast, because contact terminals are formed using silicon etching holes, the prior art described in patent document 2 may be applied to fine-pitch electrodes of a semiconductor device. Therefore, this structure has no problem when one of the semiconductor devices on a wafer is tested.

However, when many electrodes are tested, for example, when a plurality of semiconductor devices on a wafer are tested at the same time, it becomes difficult to form wires connected from the contact terminals to the wiring substrate. More specifically, as the number of contact terminals increases, the number of wirings connected from the contact terminals to the multi-layer wiring substrate increases. One of solutions to this problem is to form a multi-layer wiring layer to prevent the wires drawn from the contact terminals from shorting. However, because contact terminals are formed on the wiring layer, increasing the number of layers of the wiring layer makes the fabrication process complicated and involves technical difficulties.

It is an object of the present invention to provide test equipment that can test a plurality of semiconductor devices, each with a fine-pitch electrode structure, at the same time.

It is another object of the present invention to provide a semiconductor device fabrication method that lowers the whole fabrication cost by lowering the cost of the semiconductor device test process and that increases the throughput.

To achieve any of the objects described above, the outline of the representative inventions disclosed in this application will be given below.

(1) A probe sheet comprising contact terminals that get into contact with electrodes provided on a wafer; wirings drawn from the contact terminals; and electrode pads electrically connected to the wirings, wherein a pitch of the electrode pads is wider than a pitch of the contact terminals.

(2) A probe card comprising a probe sheet having contact terminals that get into contact with electrodes provided on a wafer; and a multi-layer wiring substrate on which electrodes, which are electrically connected to the contact terminals, are provided on a surface opposed to the wafer, wherein a pitch of the electrodes provided on the surface of the multi-layer wiring substrate opposed to the wafer is wider than a pitch of the contact terminals.

(3) A probe card comprising contact terminals that get in contact with electrodes provided on a wafer; and a multi-layer wiring substrate having electrodes electrically connected to the contact terminals, wherein the electrodes of the multi-layer wiring substrate are provided in a device-opposed-area on the multi-layer wiring substrate and a pitch of the electrodes is wider than a pitch of the contact terminals.

(4) Semiconductor test equipment comprising a stage on which a wafer is mounted; and a probe card having contact terminals that get in contact with electrodes of semiconductor devices formed on the wafer and electrically connected to a tester that tests electrical characteristics of the semiconductor devices wherein the probe card comprises a probe sheet having the contact terminals and a multi-layer wiring substrate whose electrodes electrically connected to the contact terminals are provided on a surface opposed to the wafer and wherein a pitch of the electrodes of the multi-layer wiring substrate provided on the surface opposed to the wafer is wider than a pitch of the contact terminals.

(5) A semiconductor device fabrication method comprising the steps of creating circuits on a wafer to form semiconductor devices; testing electrical characteristics of the semiconductor devices; and dicing the wafer into semiconductor devices wherein, in the step of testing electrical characteristics of the semiconductor devices, a plurality of semiconductor devices are tested at a time using a probe card comprising a probe sheet having contact terminals that get in contact with electrodes of the semiconductor devices and a multi-layer wiring substrate electrically connected to the contact terminals and having electrodes, whose pitch is wider than a pitch of the contact terminals, on a surface opposed to the wafer.

Other objects, features and advantages of the invention will become apparent from the following description of the embodiments of the invention taken in conjunction with the accompanying drawings.

BRIEF DESCRIPTION OF THE DRAWINGS

FIGS. 10A–10G are diagrams showing a part of the fabrication process for forming a probe sheet (structure) in a probe card of the present invention;

FIG. 21 is a process diagram showing one embodiment of the test process of semiconductor devices;

FIG. 22A shows indentations left on an aluminum electrode pad, and FIG. 22B shows indentations left on a gold bump;

FIG. 23A is a schematic cross section diagram of an QFP, FIG. 23B is a schematic cross section diagram of a BGA, and FIG. 23C is a schematic cross section diagram of a flip-chip type package;

DESCRIPTION OF THE EMBODIMENTS

Figure 1A:
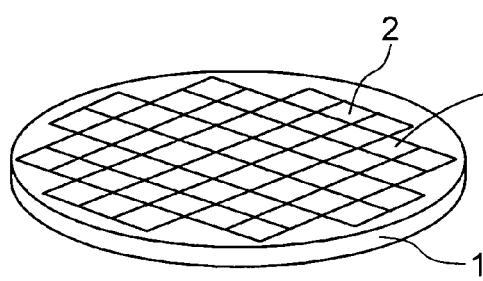
FIG. 1A is a perspective view showing a wafer which is a contact target and on which semiconductor devices (chips) are arranged.

Some embodiments of the present invention will be described in detail below with reference to the drawings. In the drawings attached to describe the embodiment of the present invention, the same reference numerals denote the same functional elements, and the same description is omitted.

Major technical terms used in this specification are defined as follows. A semiconductor device may be in any form; that is, a wafer on which integrated circuits are formed, a semiconductor device itself, or a packaged semiconductor device (QFP, BGA, CSP, and so on). A probe sheet refers to a thin film, about 10 μm to 100 μm in thickness, on which contact terminals that will get in contact with a test target and wirings drawn from the contact terminals, as well as electrodes on the wirings for external connection, are provided. A probe card refers to a structure (for example, a structure shown in FIGS. 2A–2C) having terminals that will get in contact with a test target, a multi-layer wiring substrate, and so on. Semiconductor test equipment refers to test equipment having a probe card and a sample-mounting table on which a test target is mounted.

Figure 1B:
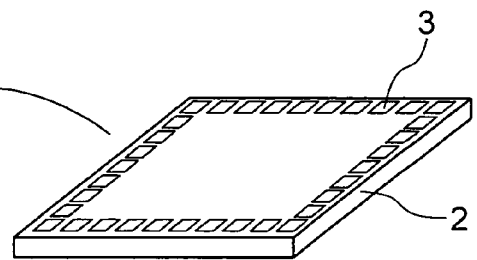
FIG. 1B is a perspective view showing a semiconductor device (chip)

A number of LSI semiconductor devices (chip) 2, which are an example of a test target, are formed on a wafer 1 as shown in FIGS. 1A–1B and, then, cut into individual die for use. FIG. 1A is a perspective view showing the wafer 1 on which many semiconductor devices 2 are arranged, and FIG. 1B is a close-up perspective view showing one semiconductor device 2. On the surface of the semiconductor device 2, many electrodes 3 are arranged along its four sides.

Today, as a semiconductor device becomes denser, the electrodes 3 become denser and their pitches become finer. The electrode pitch is finer than 0.1 mm, for example, 0.08 mm, 0.05 mm, or finer. The electrodes tend to be arranged densely along the four sides, in one row, in two rows, and all over the surface.

Another tendency is that the high-temperature operation test (85° C.–150° C.) is made by putting semiconductor devices in a high temperature environment to clearly make sure their characteristics and reliability.

The semiconductor test equipment according to the present invention is compatible with dense, fine-pitch electrodes and, in addition, makes possible various types of check including the multiple-chip simultaneous probing test and the high-speed electrical signal (100 MHz—several GHz) test.

In addition, a part of the construction material of the probe card in the semiconductor test equipment uses a material, which has a heat resistance of 150° C. and a linear expansion coefficient approximately equal to that of a test object, prevents the tip of the probe from being misaligned at the ambient temperature.

The structure of the probe card according to the present invention will be described.

Figure 2A:
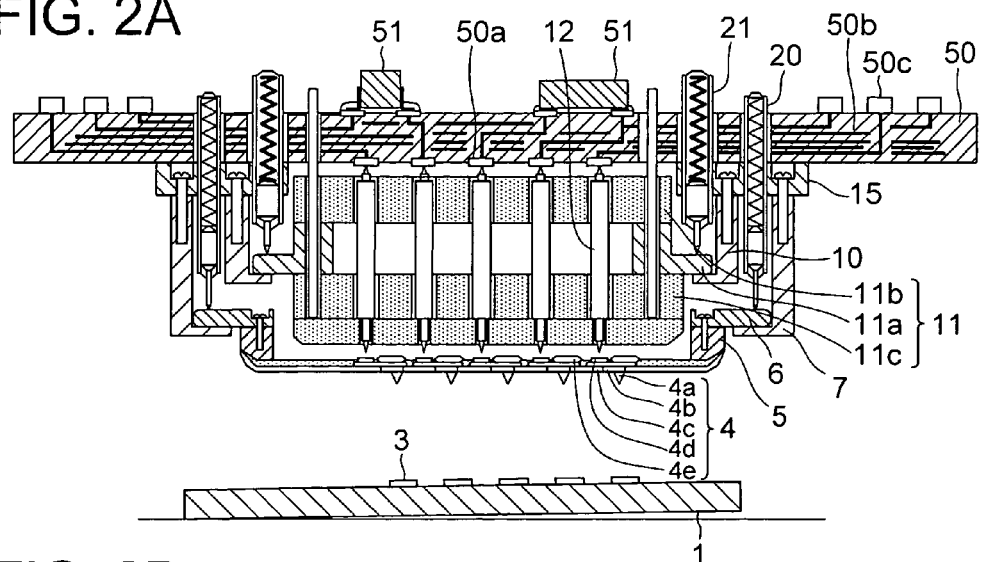
FIG. 2A is a cross section diagram showing the major part of a probe card in a first embodiment of the present invention and showing the status immediately before probing operation.
Figure 2B:
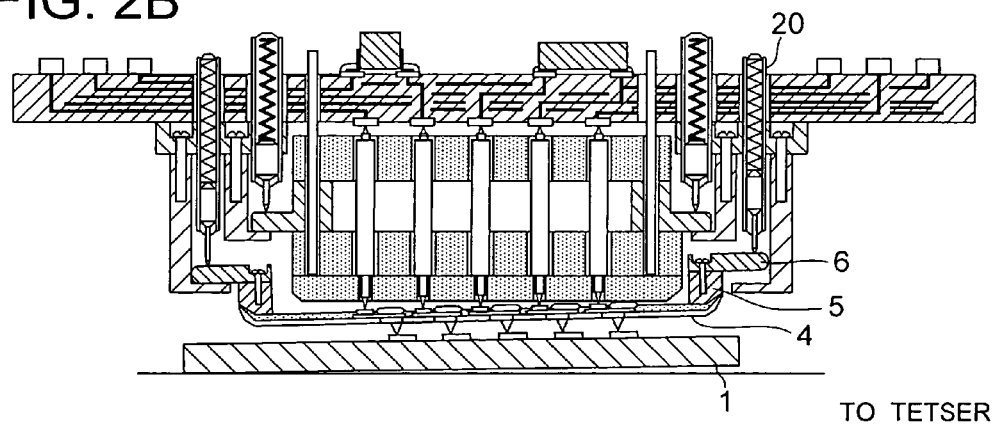
FIG. 2B is a cross section diagram showing the status of the probe card that initially follows the slant of a wafer surface.
Figure 2C:
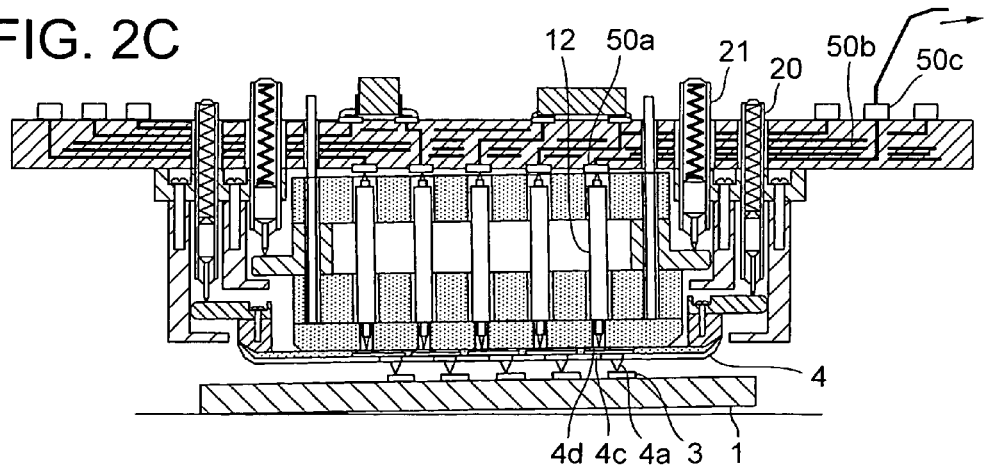
FIG. 2C is a cross section diagram showing the status of the probe card that adds a desired load on the wafer surface to make an electrical characteristic test.

FIGS. 2A–2C show the major parts of a probe card in a first embodiment of the present invention and show, in stages, the probing-time operation when there is a slight slant between the electrodes on the wafer and the contact terminals on the test equipment. FIG. 2A is a cross section diagram showing the status of the test equipment immediately before the probing operation, FIG. 2B is a cross section diagram showing the status of the test equipment that initially follows the slant of a wafer, and FIG. 2C is a cross section diagram showing the status of the test equipment that adds a desired load on the wafer surface to make an electrical characteristic test.

FIG. 2A shows the status of the test equipment immediately before the probing operation.

Spring probes 12 are inserted into a pressure member 11 composed of a pressure member holding substrate 11a held between a spring probe positioning upper substrate 11b and a spring probe positioning lower substrate 11c. One end of each spring probe 12 is connected to an electrode 50a on a multi-layer wiring substrate 50, and the other end is positioned right above an electrode 4d on a probe sheet 4. A probe sheet frame 5 around the probe sheet 4 is fixed on a probe sheet holding substrate 6.

The parallel motion and pressure mechanism that moves the probe sheet 4 comprises the probe sheet holding substrate 6 that are pressed onto temporary parallel motion holding members (bottom) 7, fixed on the multi-layer wiring substrate 50, by a plurality of auxiliary springs 20; and the pressure member holding substrate 11a that is pressed onto temporary parallel motion holding members (top) 10, fixed on the multi-layer wiring substrate 50, by a plurality of main springs 21. The spring probe 12 inserted into the pressure member 11 is positioned right above the electrode 4d on the probe sheet 4 but not in contact with the electrode 4d. It is easily understood that the spring probe 12 may be slightly in contact with the electrode 4d.

FIG. 2B shows the next stage in which the probe sheet 4 is pressed onto the surface of the wafer 1 that is at a slant. This causes an initial variation in the probe sheet 4 to be transmitted to the probe sheet holding substrates 6 via the probe sheet frame 5 and pushes up a part of auxiliary springs 20 to make the probe sheet 4 follow the slant of the wafer 1. In this state, all contact terminals are in contact with the electrodes on the wafer. Minimizing the pressure of the auxiliary springs 20 (for example, about 1N) reduces the load on the contact terminals that first get into contact and, at the same time, allows all contact terminals to be brought into contact with the electrodes under a light load.

FIG. 2C shows the test equipment in the last stage in which the test equipment applies a desired load to the surface of the wafer 1 to make an electrical characteristic test. In this state, the total load of the main springs 21, auxiliary springs 20, and spring probes 12 is applied to all contact terminals with the spring probes 12 in contact with the electrodes 4d on the probe sheet 4. Electrical signals for use in testing are sent to, and received from, a tester (not shown), which tests the electrical characteristics of semiconductor devices, through contact terminals 4a in contact with the electrodes 3 on the wafer 1, connection electrode parts 4b, pitch extension wires 4c, electrodes 4d, spring probes 12, electrodes 50a, internal wires 50b, and electrodes 50c.

The electrode 50a and the electrode 50c in the multi-layer wiring substrate 50 described above are electrically connected via substrate-installed parts 51 that include capacitors and resistors for preventing fluctuations in test signals of semiconductor devices and fuses for cutting off over-currents of faulty semiconductor devices. To achieve the effect described above, fuses may be provided, one for each electrode or semiconductor device or one for a plurality of electrodes or semiconductor devices. In the structure described above, wirings are drawn almost vertically from the contact terminals (spring probes in the first embodiment) and are connected to the electrodes 50a in the multi-layer wiring substrate. This structure allows the substrate-installed parts 51 to be placed near the electrodes 3 on the wafer 1 and minimizes the distance from the electrodes 3 to the substrate-installed parts 51, thus stabilizing the signals and allowing high-speed signals to be processed. It is desirable that the electrodes 50a be formed in a device-opposing area on the multi-layer wiring substrate. The device-opposing area on the multi-layer wiring substrate refers to an area on the multi-layer wiring substrate that is above the probe sheet, an area created above semiconductor devices that are created on the wafer and that are to be tested, or an area near that area.

For the auxiliary springs 20 and main springs 21, spring plungers, spring probes, or springs having an appropriate pressure may be used. To increase elastic force, an elastomer 4e may of course be used on the probe sheet 4.

The following describes a wiring pattern on the probe sheet 4 described above with reference to FIGS. 3A–3B.

Figure 3A:
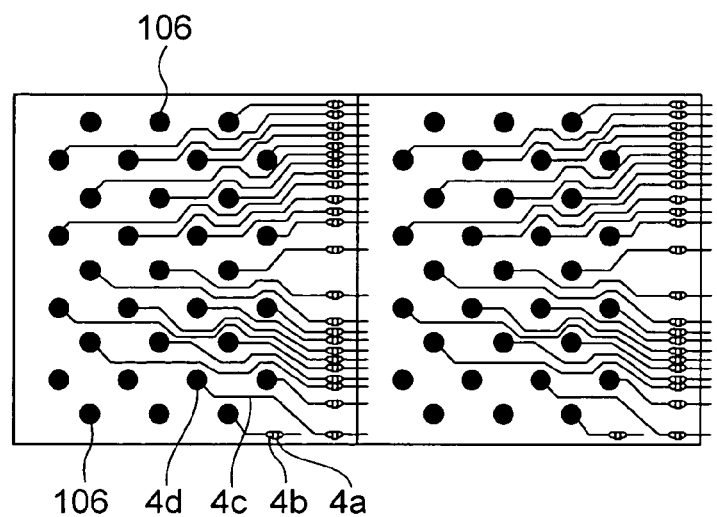
FIGS. 3A–3B show examples of wiring patterns on a probe sheet on a probe card of the present invention.
Figure 3B:
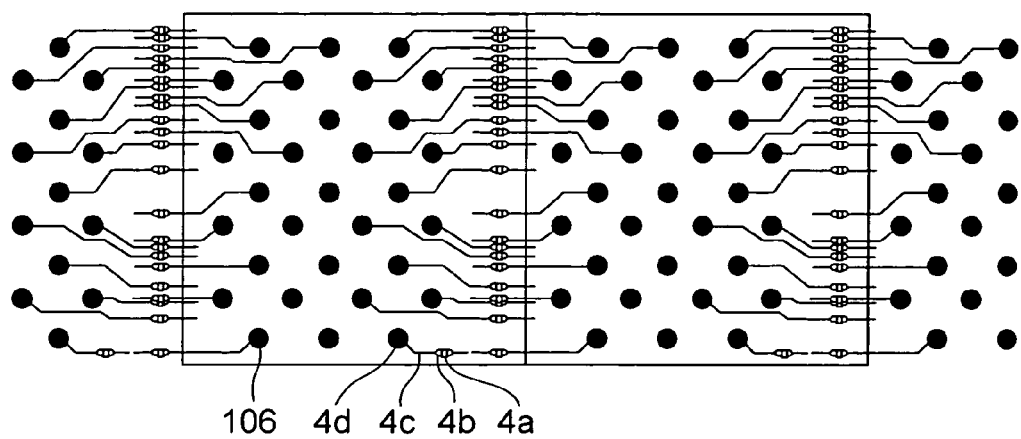

FIGS. 3A–3B show an example of a wiring pattern on the probe sheet on which contact terminals 4a, connection electrode parts 4b, pitch extension wires 4c, and vertical wire-drawing electrodes 4d (connection electrodes for spring probe or wire probe) are formed.

FIG. 3A shows an example in which the above described wiring pattern is formed independently for each semiconductor device 2 (chip). FIG. 3B shows an example in which the above described wiring pattern is formed across the semiconductor device 2 (For reference, the area corresponding to the semiconductor device 2 is described on the probe sheet 4).

Both patterns are characterized in that the vertical lead-wire electrodes (electrode pad) 4d are more widely pitched than the contact terminals 4a. The configuration in which the vertical wire-drawing connection parts (spring probe or wire probe) are electrically connected to widely pitched electrodes 4d makes the wiring to the tester easy, thus allowing the probe sheet to be used for a semiconductor device having fine-pitch, dense electrodes.

To easily satisfy the need to change the electrode arrangement on the semiconductor device 2 or to change the number of electrode pads necessary for the test, it is possible that auxiliary electrodes 106 are assumed on the probe sheet and that holes, into which the auxiliary spring probes or wire probes are to be inserted, may be provided in advance at the assumed positions on the spring probe positioning upper substrate 11b and the spring probe positioning lower substrate 11c corresponding to those electrodes. Although the electrode arrangement pattern in this embodiment is a square grid pattern, the pattern is not limited to this; the pattern may be changed to one of various patterns including a triangle grid pattern and a hexangular grid pattern. In addition, the signal electrodes, may be arranged in the outer positions (separated positions), and a plurality of ground electrodes (electrodes for power supply) may be combined into one electrode.

For the contact terminals 4a provided on the probe sheet 4, pyramid-shaped or truncated-pyramid-shaped contact terminals formed by utilizing the holes created by anisotropic etching on a crystalline member are used. This provides a stable contact resistor (about 0.05Ω–0.1Ω) having a low stylus force (contact pressure with an electrode is about 3–50 mN per pin), prevents damages to the chip, and minimizes indentations that may be created on the semiconductor device during the test. The details of the contact terminals 4a and probe sheet 4, as well as their production method, will be described later.

Figure 4:
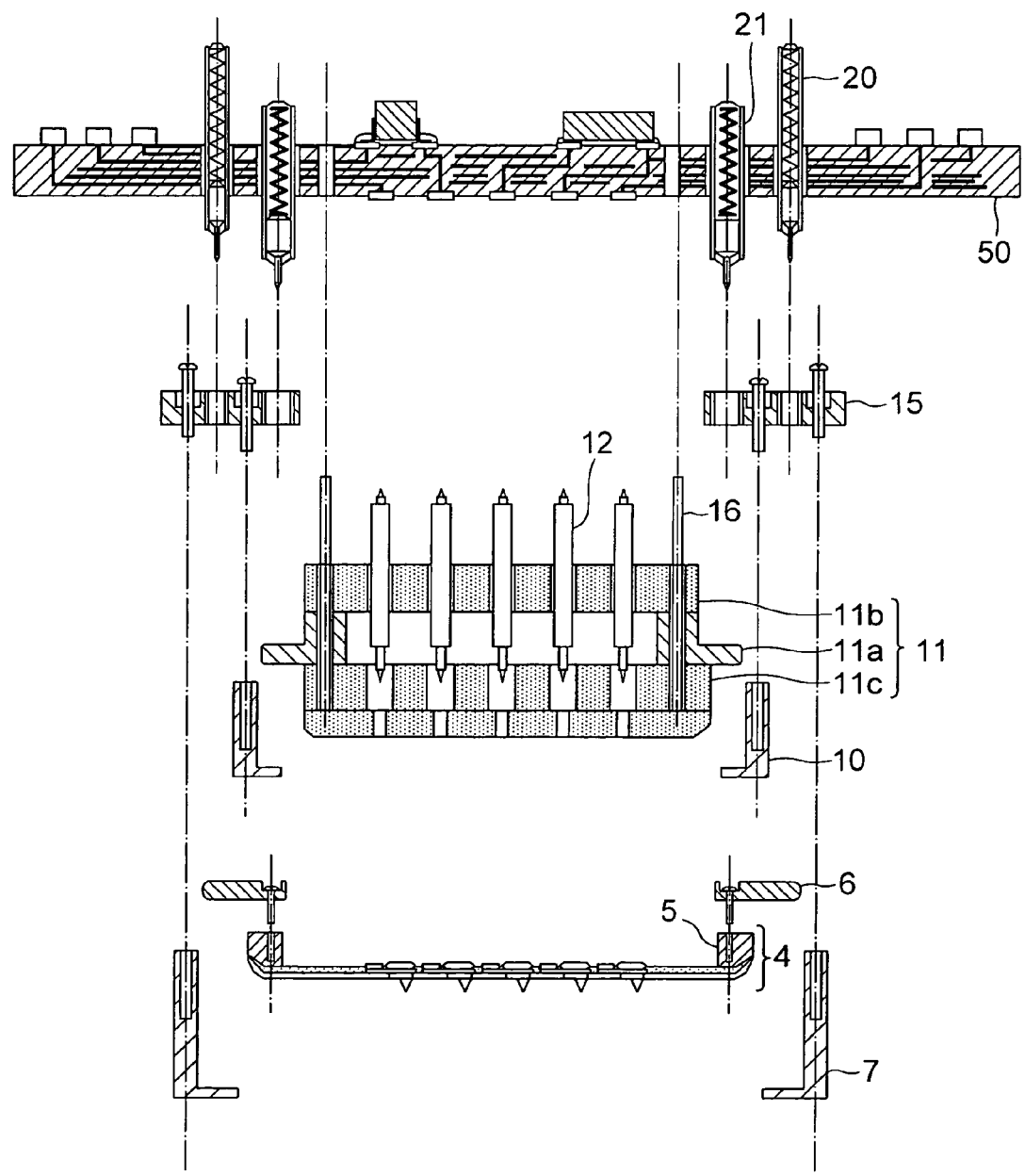
FIG. 4 is a schematic view showing how the probe card of the present invention is assembled.

The probe sheet 4 with the wiring pattern shown in FIGS. 3A–3B is installed on the press mechanism shown in FIGS. 2A–2C to complete a probe card. That is, as shown in FIG. 4, the spring probes 12 are first pushed into the pressure member 11, which is composed of the pressure member holding substrate 11a positioned and fixed between the spring probe positioning upper substrate 11b and the spring probe positioning lower substrate 11c by dowel pins 16. With the pressure member 11 held inside the temporary parallel motion holding members (top) 10, the temporary parallel motion holding members (top) 10 is fixed on the multi-layer wiring substrate installation fixing plates 15. Next, with the probe sheet holding substrates 6 held inside the probe sheet frame 5 of the probe sheet 4 by the temporary parallel motion holding member (bottom) 7, the temporary parallel motion holding member (bottom) 7 is fixed on the multi-layer wiring substrate installation fixing plates 15. Next, the fixing plates 15 are positioned with the dowel pins 16 and fixed on the multi-layer wiring substrate 50. After that, the auxiliary springs 20 and the main springs 21 are fixed on the multi-layer wiring substrate installation fixing plates 15 such that the load becomes a desired initial load. In this way, the probe card is built.

Figure 5:
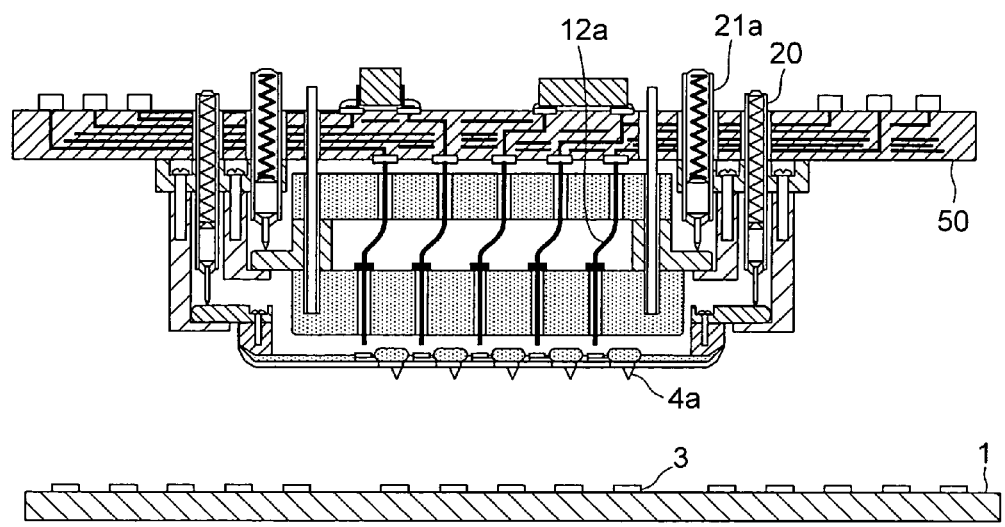
FIG. 5 is a cross section diagram showing the major part of a probe card in a second embodiment of the present invention.

Next, with reference to FIG. 5, a probe card in a second embodiment of the present invention will be described. In this embodiment, wire probes 12a are used instead of the spring probes 12 in FIGS. 2A–2C. Wires, used for the wire-drawing connection parts, enable the electrodes to be arranged in finer pitches than in the first embodiment in which spring probe widths result in restrictions, making it possible to increase the density of semiconductor device electrodes 3. The probing operation performed when there is a slight slant between the electrodes 3 on the surface of the wafer 1 and the contact terminals 4a on the probe card is the same as that in the description of FIGS. 2A–2C and, therefore, the description is omitted.

Figure 6:
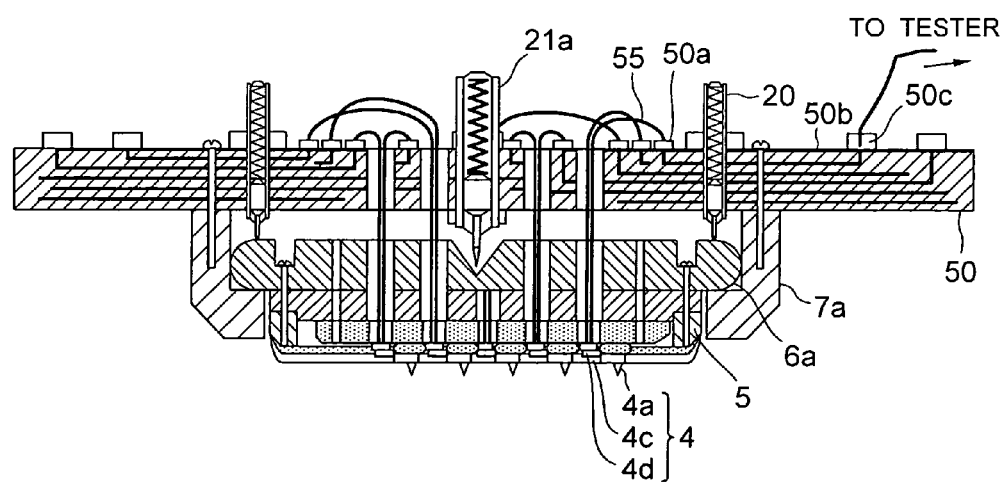
FIG. 6 is a cross section diagram showing the major part of a probe card in a third embodiment of the present invention.

FIG. 6 is a cross section diagram showing the major part of a probe card in a third embodiment of the present invention. Bonding wires 55 are used for conduction from the lead-wire electrodes 4d on a probe sheet 4 to the electrodes 50a on a multi-layer wiring substrate 50. The bonding wire 55 is, for example, a gold wire or a gold wire coated with insulating materials. The moving action part of the probe card is constituted by a main spring (center pivot) 21a that fixes the probe sheet 4 onto a probe sheet holding substrate 6a through a probe sheet frame 5, that presses the probe sheet holding substrate 6a onto a temporary parallel motion support member (bottom) 7a fixed on the multi-layer wiring substrate 50 through a plurality of auxiliary springs 20, and that is positioned in the center of the probe sheet holding substrate 6a and fixed on the multi-layer wiring substrate 50. In this case, the tip of the main spring 21a is slightly spaced (about 0.05 mm) from the upper surface of the probe sheet holding substrate 6a. This prevents the load of the main spring 21a from placing on a part of the contact terminals before all contact terminals get in contact with the electrodes on the wafer surface during the initial 'follow-operation' and thus prevents the load from concentrating on a part of the contact terminals. When there is a slight slant between the electrodes on the wafer surface and the contact terminals on the probe card, the operation is performed as follows during the probing operation. That is, the probe sheet 4 is pressed on the surface of the wafer 1 that is at a slant, the initial variation in the probe sheet 4 is transmitted to the probe sheet holding substrate 6a via the probe sheet frame 5, a part of the auxiliary springs 20 are pushed up to cause the sheet to follow the slant of the wafer 1, and all contact terminals get into contact with the electrodes on the wafer. Minimizing the pressure of the auxiliary springs 20 (for example, about 1N) reduces the load on the contact terminals that first get into contact and, at the same time, allows all contact terminals to be brought into contact with the electrodes under a light load.

Further pressing the probe sheet 4 until a predetermined value (overdrive amount) is reached adds the total load (a desired load) of the main spring 21a and the auxiliary springs 20 to all contact terminals. In this state, electrical signals for use in testing are sent to, and received from, a tester (not shown) through contact terminals 4a in contact with the electrodes 3 on the wafer 1, pitch extension wires 4c, electrodes 4d, bonding wires 55, electrodes 50a, internal wirings 50b, and electrodes 50c.

Figure 7:
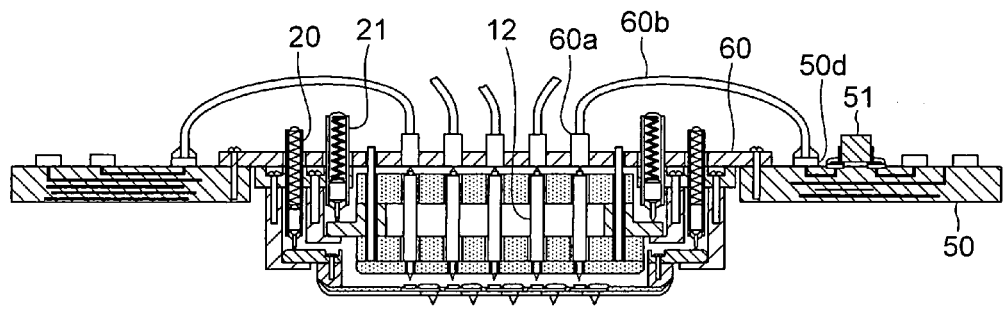
FIG. 7 is a cross section diagram showing the major part of a probe card in a fourth embodiment of the present invention.

FIG. 7 is a cross section diagram showing the major part of a probe card in a fourth embodiment of the present invention. This probe card differs from the probe card in the first embodiment in that one end of a spring probe 12 is in contact with an electrode 60a formed on an electrode fixing substrate 60 instead of the electrodes 50a on the multi-layer wiring substrate 50 shown in FIGS. 2A–2C. In this configuration, one end of the spring probe is connected, via a lead wire 60b and through soldering, from the electrode 60a to an electrode 50d on the multi-layer wiring substrate 50 on which the electrode fixing substrate 60 is fixed. This configuration allows the connection between lead wire 60b and the electrode 50d on the multi-layer wiring substrate 50 to be changed, eliminates the need for the multi-layer wiring substrate 50 to be created for each wiring pattern on the probe sheet 4 but allows it to be shared, and therefore lowers the cost. In addition, the ability to remove the spring probes 12 allows the probe card to be used flexibly on any wiring patterns on the probe sheet 4. The lead wire 60b may be an enamel coated copper wire, a gold bonding wire, or a coaxial cable.

Instead of the spring probe 12, a wire probe 12a may also be used. The use of the wire probe 12a allows the multi-layer wiring substrate 50 to be shared, lowers the cost, and meets the need for processing denser test devices.

Figure 8:
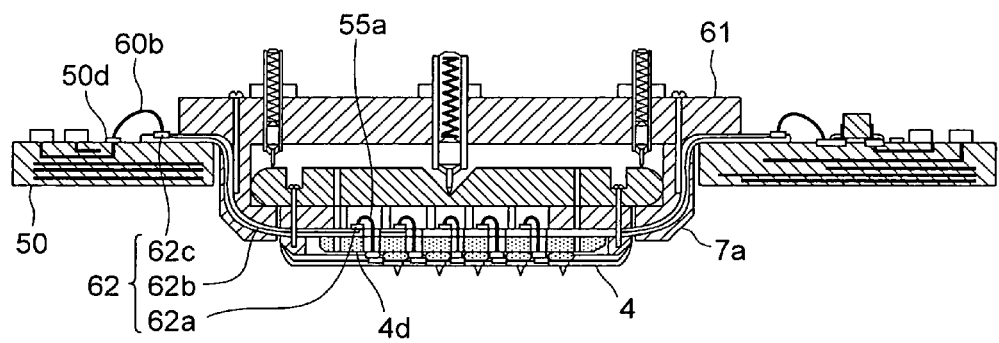
FIG. 8 is a cross section diagram showing the major part of a probe card in a fifth embodiment of the present invention.

FIG. 8 is a cross section diagram showing the major part of a probe card in a fifth embodiment of the present invention. A wire-drawing electrode 4d on a probe sheet 4 is connected to an electrode 50d on a multi-layer wiring substrate 50 as follows; one end of a bonding wire 55a is connected to the electrode 4d on the probe sheet 4 and the other end is connected to an electrode 62a on a wiring sheet 62, one end of a lead wire 60b is connected to an electrode 62c that is connected to the electrode 62a via an internal wire 62b on the wiring sheet 62, and the other end of the lead wire lead wire 60b is connected to the electrode 50d on the multi-layer wiring substrate 50 on which the wiring sheet 62 is fixed. This configuration allows the connection between the lead wire 60b and the electrode 50d on the multi-layer wiring substrate 50 to be changed and, in addition, the multi-layer wiring substrate 50 to be shared. The lead wire 60b may be a gold bonding wire, an enamel coated copper wire, or a coaxial cable.

The moving part of the probe card has a configuration almost similar to that of the third embodiment shown in FIG. 6 except that the temporary parallel motion support member (bottom) 7a is fixed, not on the multi-layer wiring substrate 50, but on a separately provided fixing substrate 61.

Figure 9:
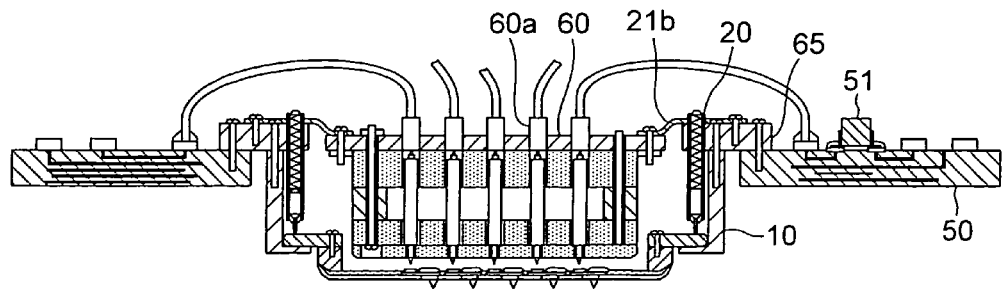
FIG. 9 is a cross section diagram showing the major part of a probe card in a sixth embodiment of the present invention.

FIG. 9 is a cross section diagram showing the major part of a probe card in a sixth embodiment of the present invention. The signal wires for testing are connected in the same manner as those in FIG. 7. A blade spring 21b is used instead of the the pressing mechanism using the main spring 21 in FIG. 7. One end of the blade spring 21b is fixed on the electrode fixing substrate 60 of an electrode 60a, and the other end of the blade spring 21b is fixed on a blade spring fixing substrate 65 that is fixed on a multi-layer wiring substrate 50 by fixing an auxiliary spring 20 and a temporary parallel motion holding member (top) 10.

In this case, a wire probe 12a may be used instead of a spring probe 12.

Next, with reference of FIGS. 10A–10G and FIGS. 11A–11D, the method for fabricating an example of a probe sheet (structure) used for the probe card will be described.

Out of the process for fabricating the probe card shown in FIGS. 2A–2C, FIGS. 11A–10G show a fabrication process for forming a metallic-film-reinforced thin film probe sheet. In particular, the figures show the fabrication process in order of steps. In this process, a truncated-pyramid-shaped contact terminal tip is formed on a pitch extension wire using an anisotropically etched, truncated-pyramid-shaped hole formed on a silicon wafer 80, which is used as a cast. Then, a metallic-film-reinforced thin film probe sheet is formed by adhering a metallic film to a polyimide adhesive sheet and by processing the metallic film to form a lead-wire electrode.

First, the step shown in FIG. 10A is performed. In this step, about 0.5 μm of a silicon dioxide film 81 is formed on both sides of the silicon wafer (100) 80, which is 0.2 mm–0.6 mm in thickness, through thermal oxidation. A photo-resist 85 is coated and, after forming a pattern the through photolithography process, the silicon dioxide film 81 is removed by etching with a mixture of hydrofluoric acid and ammonium fluoride with the photo-resist 85 as the mask.

Next, the step shown in FIG. 10B is performed. In this step, the silicon wafer 80 is anisotropically etched with a strong alkali solution (for example, potassium hydroxide), with the silicon dioxide film 81 as the mask, to form a truncated-pyramid-shaped etching hole 80a surrounded by the (111) plane.

Although the silicon wafer 80 is used as the cast in this embodiment, the cast may be any crystalline material and may be, of course, changed to any other crystalline material. Although the anisotropically etched hole is shaped like a truncated-pyramid in this embodiment, the hole may be shaped like a pyramid. The shape of the hole may be changed to any shape with which a contact terminal 4a ensuring a reliable contact resistance with a low stylus force can be formed.

Next, the silicon dioxide film used as the mask is removed by etching with a mixture of hydrofluoric acid and ammonium fluoride, and a silicon dioxide film 82, about 0.5 μm in thickness, is formed again all over the silicon wafer 80 by performing thermal oxidation in wet oxygen.

Next, the step shown in FIG. 10C is performed. In this step, a conductive coating 83 is formed on the surface of the silicon dioxide film 82, a polyimide film 84 is formed on the surface of the conductive coating 83, and then the polyimide film 84 at the position where a contact terminal 4a is to be formed is removed until the surface of the conductive coating 83 is reached.

As the conductive coating 83, a chrome film, about 0.1 μm in thickness, is formed, for example, thorough chrome sputtering or evaporation. Then, a copper film, about 1 μm in thickness, is formed on the surface of the chrome film through copper sputtering or evaporation.

To remove the polyimide film 84 described above, either laser drilling or dry etching with an aluminum mask on the surface of the polyimide film 84 is performed.

Next, the step shown in FIG. 10D is performed. First, the conductive coating 83 exposed in the opening of the polyimide film 84 is electroplated, with the conductive coating 83 as the electrode and with materials with a high degree of hardness as its major component, to form the contact terminal 4a and the connection electrode part 4b as a unit. The conductive coating 83 is electroplated sequentially with materials with a high degree of hardness, for example, nickel 8a, rhodium 8b, and nickel 8a, to form a contact terminal part 8 that includes both the contact terminal 4a and the connection electrode part 4b.

Next, a conductive coating 86 is formed on the contact terminal part 8 and the polyimide film 84 described above, a photo-resist mask 87 is formed, and then plating is performed with a wiring material 88.

As the conductive coating described above, a chrome film, about 0.1 μm in thickness, is formed, for example, thorough chrome sputtering or evaporating. Then, a copper film, about 1 μm in thickness, is formed on the surface of the chrome file through copper sputtering or evaporation. Copper is used as the wiring material.

Next, the step shown in FIG. 10E is performed. In this step, the photo-resist mask 87 is removed, the conductive coating 86 is removed by soft etching with the wiring material 88 as the mask, and then an adhesion layer 89 and a metallic film 90 are formed.

For example, for the adhesion layer 89, a polyimide adhesive sheet or an epoxy adhesive sheet is used. For the metallic film 90, a metallic sheet such as a 42 alloy (containing 42% nickel and 58% iron with linear expansion coefficient of 4 ppm/° C.) or an invar (for example, an alloy containing 36% nickel and 64% iron with linear expansion coefficient of 1.5 ppm/° C.) which has a low linear expansion coefficient and which has a linear expansion coefficient close to that of the silicon wafer (silicon material) 80 is used. This metallic sheet is adhered to the polyimide film 84 in which the wiring material 88 has been formed in the adhesion layer 89. This configuration increases the strength and the area of the probe sheet 4 that will be formed, ensures position precision in various situations and, in addition, prevents a misalignment that may be caused by a change in the temperature at test time. In view of this, a material with a linear expansion coefficient close to that of a semiconductor device to be tested may also be used for the metallic film 90 to ensure position precision at burn-in test time.

The above adhesion step is performed, for example, by placing the silicon wafer 80, on which the contact terminal part 8 and the polyimide film 84 having therein the wiring material 88 as shown FIG. 10D, onto the adhesion layer 89 and the metallic film 90 and then by applying a temperature higher than the glass transition temperature (Tg) of the adhesion layer 89 under the pressure of 10–200 Kgf/cm$^2$ to do temperature/pressure adhesion in a vacuum.

Next, the step shown in FIG. 10F is performed. First, a photo-resist mask is formed on the metallic film 90 and the metallic film 90 is etched. When a 42 alloy film or an invar sheet is used for the metallic film 90, an iron chloride solution should be used for splay etching. The photo-resist mask may be a liquid resist or a film resist (dry film).

Next, the photo-resist mask described above is removed and the part of the adhesion layer 89 corresponding to an electrode 92 is removed by drilling until the surface of the wiring material 88 is exposed. When drilling is done by a laser, a metallic film 90a is used for the mask. The drilling method may be executed using a laser such as such as an excimer laser or a carbon dioxide gas laser or dry etching may be used to create a hole.

Next, the step shown in FIG. 10G is performed. In this step, the region corresponding to the electrode 92 that was drilled as described above is plated with nickel 92a and then with gold 92b and, after that, an elastomer (elastic material) 93 is formed on a part corresponding to the contact terminal part 8. The region is plated with the wiring material 88 as the electrode. The electrode is formed without removing the metallic film 90 to achieve the effect described in the process in FIG. 10E and to allow the metallic film 90 to be used as the ground layer for preventing signal disturbances.

For example, as the elastomer 93, an elastic resin is printed or applied by a dispenser or a silicon sheet is installed. The function of the elastomer 93 is that it reduces the overall impact when the tips of many contact terminals get in contact with the electrodes 3 arranged on the semiconductor wafer 1. Another function is that the elastomer 93, which has local irregular shapes, smoothes several μm or smaller variations in the heights of the contact terminals on the probe sheet to enable the contact terminals to fit them to the variations in height in the range of about ±0.5 μm to evenly get into contact with the contact targets (electrodes) 3 arranged on the semiconductor wafer 1.

Figure 11A:
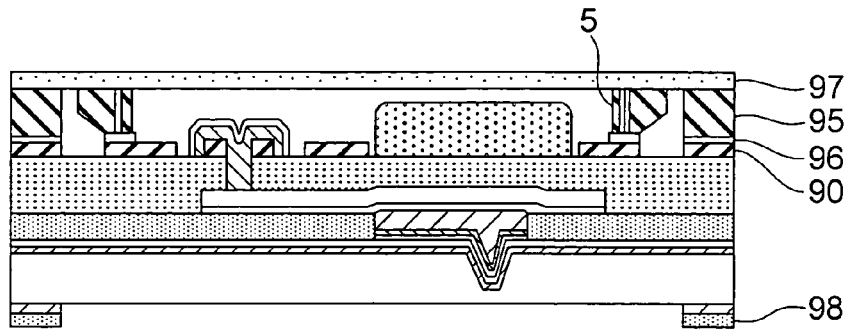
FIGS. 11A–11D are diagrams showing the fabrication process that follows FIGS. 10A–10G.

Next, the step shown in FIG. 11A is performed. In this step, a probe sheet frame 5 and a process ring 95 are adhered to the metallic film 90 with an adhesion bond 96, a protective film 97 is adhered to the probe sheet frame 5 and the process ring 95, and the silicon dioxide is removed by etching with a mixture of hydrofluoric acid and ammonium fluoride with a center-drilled protective film 98 as the mask.

Figure 11B:
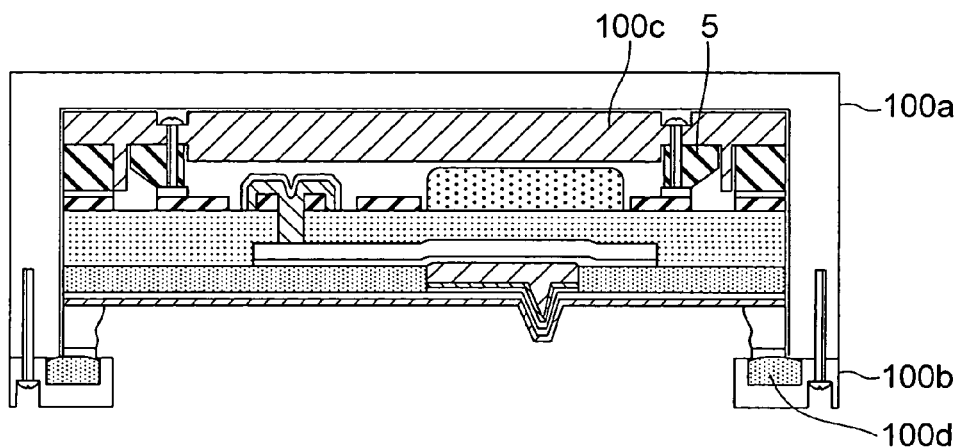

Next, the step shown in FIG. 11B is performed. In this step, the protective films 97 and 98 described above are peeled off, a silicon etching protective jig 100 is installed, and the silicon is removed by etching.

For example, the frame 5 is screwed on an intermediate fixing plate 100c, a stainless-steel fixing jig 100a and a stainless-steel cover 100b are installed with an O ring 100d between them, and the silicon wafer 80, which is the material, is removed by etching with a strong alkali solution (for example, potassium hydroxide).

Figure 11C:
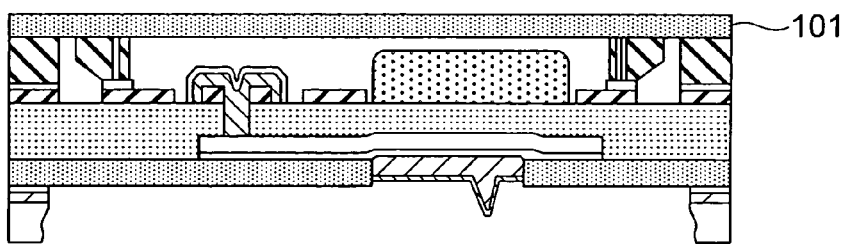

Next, the step shown in FIG. 11C is performed. In this step, the silicon etching protective jig 100 is removed, a protective film 101 is adhered, and the silicon dioxide film, chrome film, copper film, and nickel film are removed by etching. The silicon dioxide film 82 is removed by etching with a mixture of hydrofluoric acid and ammonium fluoride, the chrome film is removed by etching with a permanganic acid kalium solution, and the copper film and the nickel film are removed by etching with an alkaline copper etching solution.

As a result of a sequence of etching processing, the rhodium plating exposed on the surface of contact terminals is used. This plating is used because it prevents solder and Al, which are the materials of the electrodes 3, from adhering, is harder than nickel, is not easily oxidized, and therefore ensures stable contact resistance.

Figure 11D:
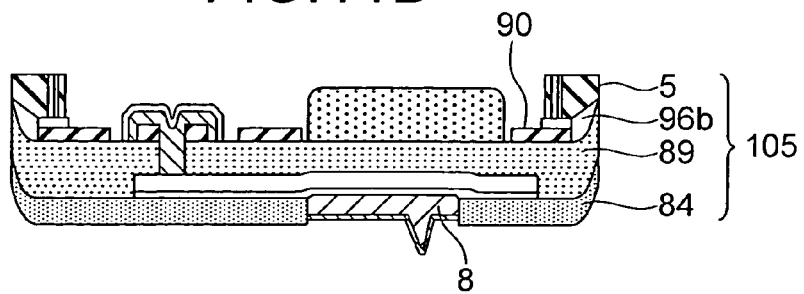

Next, the step in FIG. 11D is performed. First, an adhesive bond 96b is applied between the probe sheet frame 5 and the adhesion layer 89 and, while pushing the probe sheet frame 5, the end of the probe sheet frame 5 is fixed on the deformed adhesion layer 89.

Next, the polyimide film 84, adhesion layer 89, and adhesive bond 96b, which are combined into one unit running along the peripheral part of the probe sheet frame 5, are cut into a probe sheet structure 105.

Next, with reference to FIGS. 12A–12G, a probe sheet (structure) in a second embodiment that is different from the probe sheet (structure) described above, its structure, and its fabrication method will be described.

FIGS. 12A–12G show, in order of steps, another fabrication process for forming a probe sheet (structure).

Figure 12A:
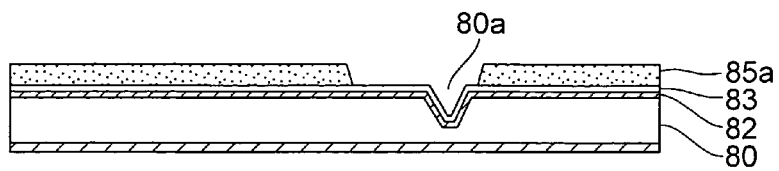
FIGS. 12A–12G are diagrams showing another fabrication process, in order of steps, for forming a probe sheet in a probe card of the present invention.

First, after executing the step shown in FIGS. 10A–10B in which the truncated-pyramid-shaped etching hole 80a is formed on the silicon wafer 80 and the silicon dioxide film 82 is formed on its surface, the step shown in FIG. 12A is performed. In this step, a photo-resist mask 85a is formed on the surface of the conductive coating 83, which is formed on the silicon dioxide film 82, to create an opening for a contact terminal part 8.

Figure 12B:
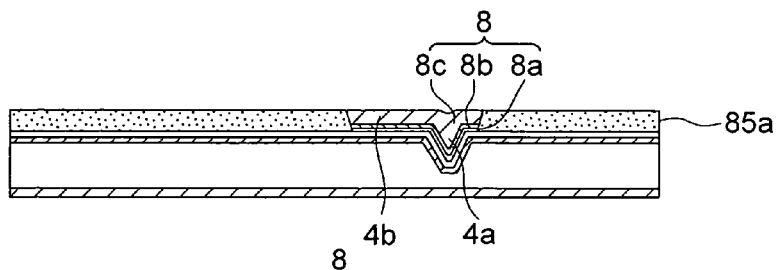

Next, with the photo-resist mask 85a shown in FIG. 12B as the mask, the conductive coating 83 is electroplated as a power feeding layer and a contact terminal 4a and a connection electrode part 4b are formed as a unit. The conductive coating 83 is plated sequentially with nickel 8a, rhodium 8b, and nickel 8c to form a contact terminal part 8 with the contact terminal 4a and the connection electrode part 4b as a unit.

Figure 12C:

Next, the step shown in FIG. 12C is performed. In this step, the photo-resist mask 85a described above is removed.

Figure 12D:
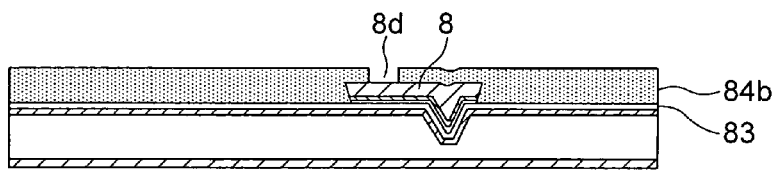

Next, the step shown in FIG. 12D is performed. In this step, a polyimide film 84b is formed so that it covers the contact terminal part 8 and the conductive coating 83. A part of the polyimide film 84b, corresponding to the position where a lead wire connection hole 8d leading to the contact terminal part 8 is to be formed, is removed until the surface of the contact terminal part 8 is reached.

For example, to remove a part of the polyimide film 84b, laser drilling processing is performed or the polyimide film 84b is dry-etched with an aluminum mask on its surface.

Figure 12E:
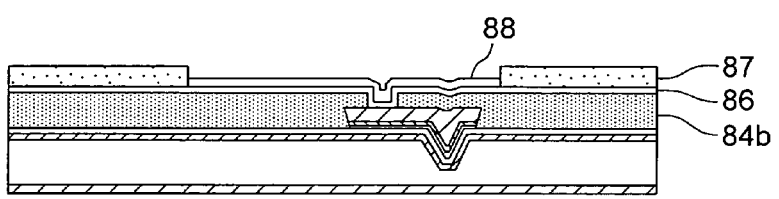

Next, the step show in FIG. 12E is performed. In this step, a conductive coating 86 is formed on the polyimide film 84b, a photo-resist mask 87 is formed, and the wiring material 88 is plated.

As the conductive coating, a chrome film, about 0.1 μm in thickness, is formed, for example, thorough chrome sputtering or evaporation. Then, a copper film, about 1 μm in thickness, is formed on the surface of the chrome file through copper sputtering or evaporation. The wiring material is a copper-plated material or a copper-plated material that is nickel-plated.

Figure 12F:
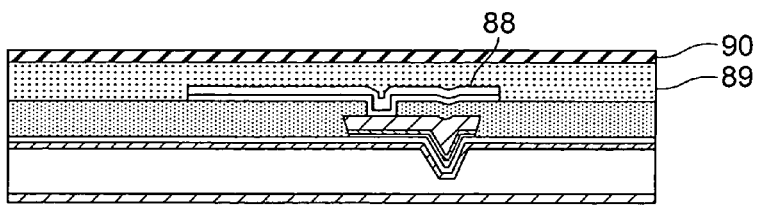

Next, the step shown in FIG. 12F is performed. In this step, the photo-resist mask 87 described above is removed, the conductive coating 86 is removed by etching with the wiring material 88 as the mask, and an adhesion layer 89 and a metallic film 90 are formed.

Figure 12G:
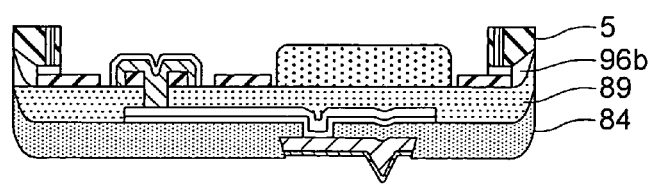

Next, after the same steps as those in FIGS. 10F–10G and FIGS. 11A–11D, the probe sheet structure 105 shown in FIG. 12G is fabricated.

With reference to FIGS. 13A–13F, a probe sheet (structure) in a third embodiment, its structure, and its fabrication steps will be described.

The probe sheet fabrication method in this embodiment is the same as the probe sheet fabrication method described in FIGS. 10A–10G and FIGS. 11A–11D. The major difference is that a dummy terminal 107 similar to the contact terminal 4a in shape is created at the same time the contact terminals 4a is created. The dummy terminal 107 is provided to prevent the probe sheet 4 from being deformed when it gets into contact with the electrode 3 on the wafer 1 and to prevent a load from being concentrated initially on the end of the contact terminals. The dummy terminal 107 need not have the same shape as that of the contact terminal 4a but, as shown in FIGS. 13A–13F, may have the shape of a truncated pyramid with a base area (area in contact with wafer 1) larger than that of the contact terminal 4a. A similar dummy terminal 107 may also be formed when fabricating a probe sheet in other probe sheet fabrication methods.

With reference to FIGS. 13A–13F, an example of a method for fabricating the dummy terminal will be described below.

Figure 13A:
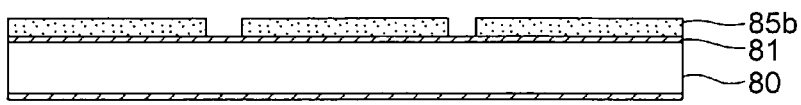
FIGS. 13A–13D are diagrams showing another fabrication process, in order of steps, for forming a probe sheet in a probe card of the present invention.

First, the step shown in FIG. 13A is performed. In this step, a silicon dioxide film 81, about 0.5 μm in thickness, is formed on both sides of the silicon wafer 80, which is 0.2 mm–0.6 mm in thickness, through thermal oxidation. The silicon dioxide film 81 is removed by etching with a mixture of hydrofluoric acid and ammonium fluoride using a photo-resist mask 85b as the mask.

Figure 13B:

Next, the silicon wafer 80 is anisotropically etched with a strong alkali solution (for example, potassium hydroxide) to form a pyramid-shaped or truncated-pyramid-shaped etching holes 80a and 80b with the silicon dioxide film 81c, partially etched in the step shown in FIG. 13B, as the mask.

Figure 13C:
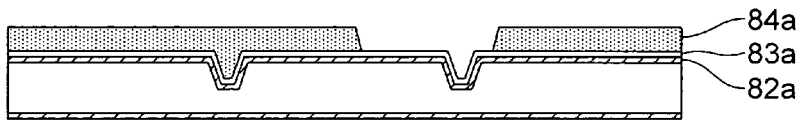

Next, the step shown in FIG. 13C is performed. In this step, the silicon dioxide film 81 used as the mask is removed by etching with a mixture of hydrofluoric acid and ammonium fluoride and a silicon dioxide film 82, 0.5 μm in thickness, is formed again on all over the silicon wafer 80 through thermal oxidation in the wet hydrogen environment. After a conductive coating 83a is formed on the surface of the silicon dioxide film 82a, a polyimide film 84a is formed on the surface of the conductive coating 83a. Then, a part of the polyimide film 84a corresponding to the position where the contact terminals 4a is to be formed is removed until the surface of the conductive coating 83a is reached.

Figure 13D:
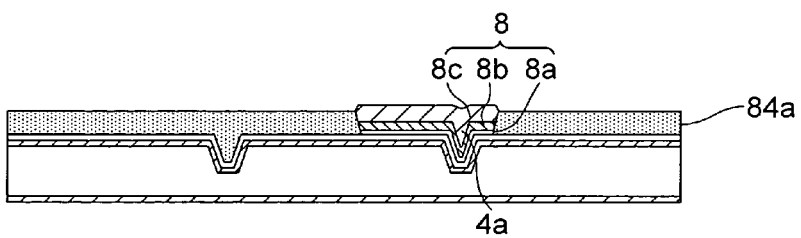

Next, the step shown in FIG. 13D is performed. In this step, the conductive coating 83a exposed in the opening of the polyimide film 84a is electroplated, with the conductive coating 83a as the electrode and with materials with high degree of hardness as its major component, to form the contact terminal 4a and the connection electrode part 4b as a unit. The conductive coating 83a is sequentially electroplated with materials with high degree of hardness, for example, nickel 8a, rhodium 8b, and nickel 8c, to form a contact terminal part 8 that includes both the contact terminal 4a and the connection electrode part 4b.

Figure 13E:
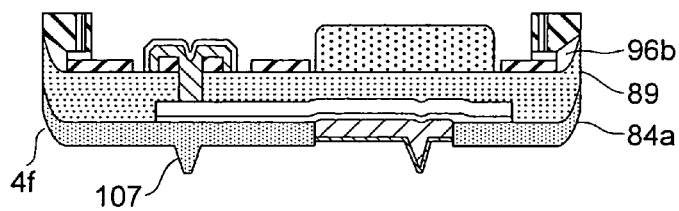
FIGS. 13E–13F are schematic cross section diagrams showing the probe sheet in the probe card of the present invention.

Next, after the same steps as those in FIGS. 10D–10G and FIGS. 11A–11D, a probe sheet structure 105 shown in FIG. 13E is fabricated.

Figure 13F:
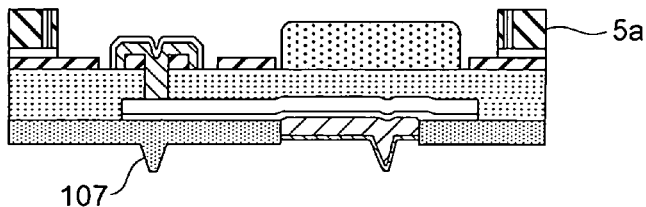

The probe sheet on which the dummy terminal 107 is formed may also have a structure in which, with no tapered section 4f provided on the end of the probe sheet, a probe sheet frame 5a is connected to the probe sheet with a square-edged end with an adhesion bond 96 as shown in FIG. 13F.

Figure 14A:
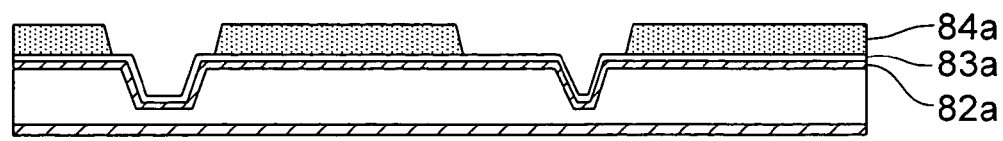
FIGS. 14A–14B are diagrams showing another fabrication process, in order of steps, for forming a probe sheet in a probe card of the present invention.
Figure 14B:
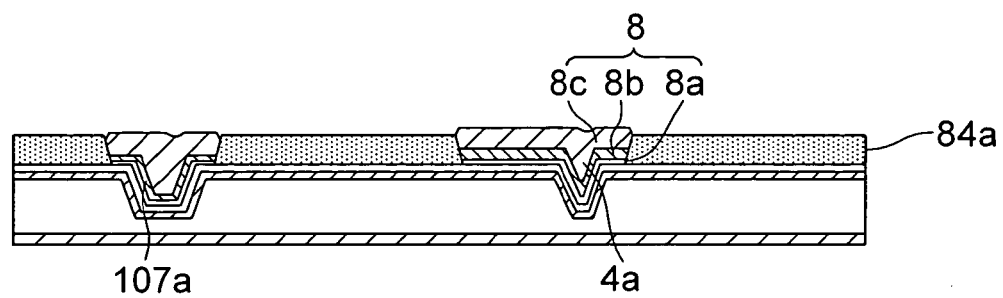
Figure 14C:
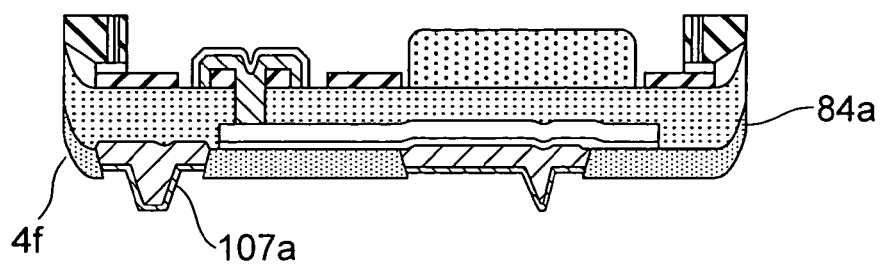
FIG. 14C is a schematic cross section diagram showing the probe sheet.

It is also possible that the part of the polyimide film 84a where the dummy terminal 107 is to be formed is partially removed in the step in FIG. 13C, that the part of the polyimide film 84a where the dummy terminal 107a shown in FIG. 14A is to be formed is removed until the surface of the conductive coating 83a is reached, that a dummy terminal 107a is formed with the same material constitution as that of the contact terminal part 8 as shown in FIG. 14B, and that the probe sheet structure 105 shown in FIG. 14C may be fabricated.

Next, with reference to FIGS. 15A–15D, a probe sheet (structure) in a fourth embodiment, its structure, and its fabrication steps will be described.

The fabrication method of this probe sheet is similar to the fabrication method of a probe sheet described in FIGS. 10A–10G and FIGS. 11A–11D except only in the way the elastic resin is formed in an area where the contact terminal part 8 is formed.

Figure 15A:
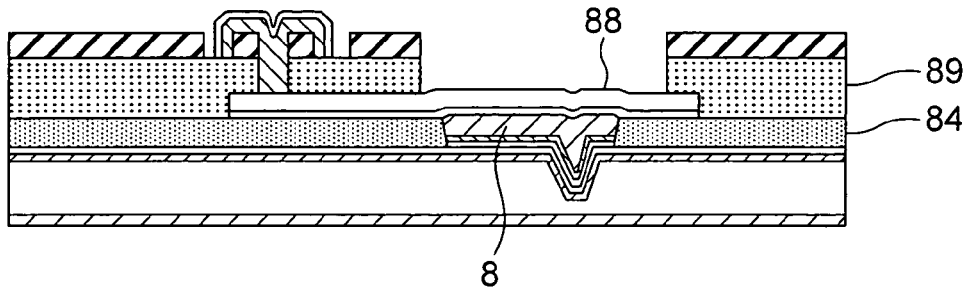
FIGS. 15A–15C are diagrams showing another fabrication process, in order of steps, for forming a probe sheet in a probe card of the present invention.
Figure 15B:
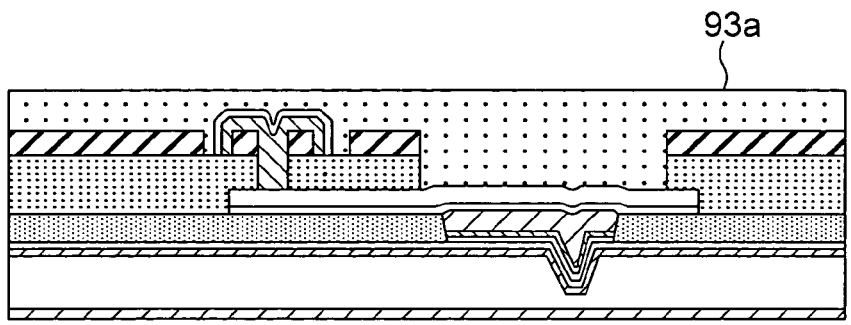
Figure 15C:
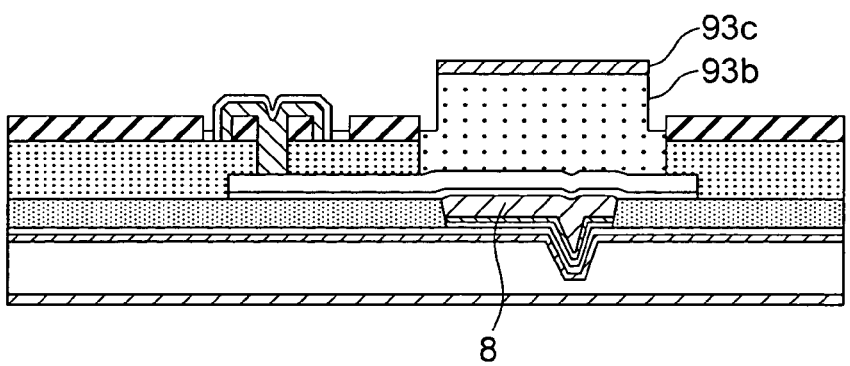

FIG. 15A shows the status in which, after the steps in FIGS. 10A–10F are executed, the adhesion layer 89 of the area where the contact terminal part 8 is formed and the part of the polyimide film 84 not covered by the wiring material 88 are removed by a laser. After that, the step shown in FIG. 15B is performed in which an elastic resin 93a is printed or is formed by a dispenser. After that, as shown in FIG. 15C, an elastic resin layer is formed such that an elastic resin layer 93b remains in the area where the contact terminal part 8 is formed. An unnecessary elastic resin layer can be removed by a laser, for example, using an aluminum mask 93c.

Figure 15D:
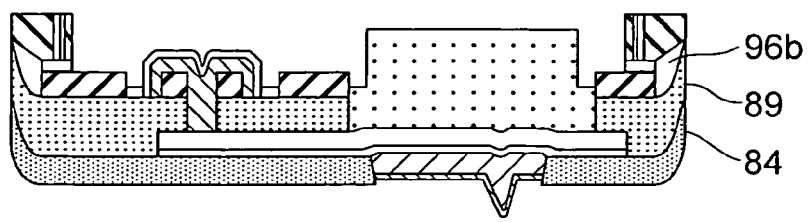
FIG. 15D is a schematic cross section diagram showing the probe sheet.

Next, after the same steps as those in FIGS. 11A–11D, the step shown in FIG. 15D is performed. In this step, the polyimide film 84, adhesion layer 89, and adhesive bond 96b, which are combined into one unit running along the peripheral part of the probe sheet frame 5, are cut into a probe sheet structure.

This configuration allows the elastic resin layer to be formed such that it is in direct contact only with the area of the contact terminal part 8, thus increasing flexibility in the area of the contact terminal part 8.

Figure 16A:
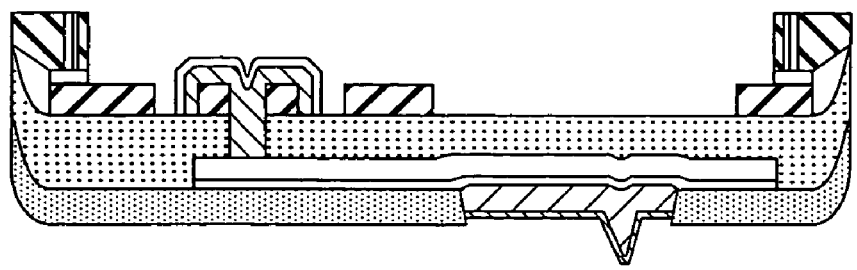
FIGS. 16A–16B are diagrams showing another fabrication process, in order of steps, for forming a probe sheet in a probe card of the present invention.
Figure 16B:
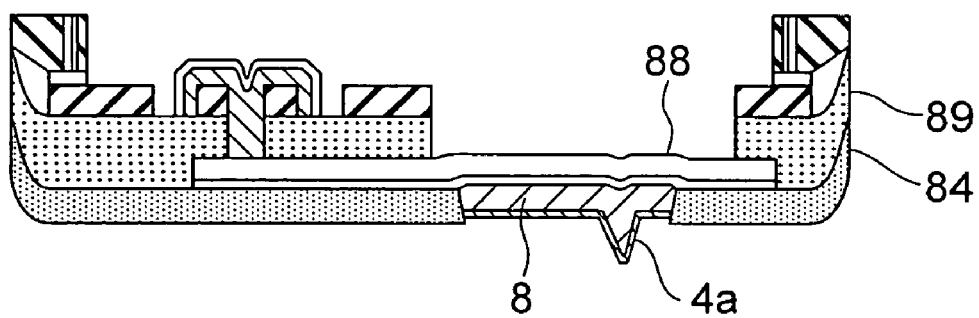
Figure 16C:
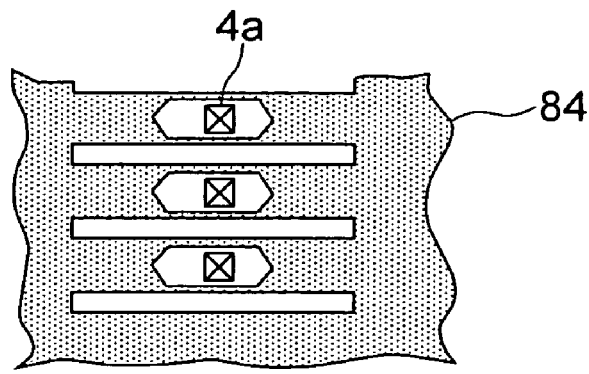
FIG. 16C is a plan view showing a part of the area of a contact terminal part 8 shown in FIG. 16B as viewed from the bottom.

FIGS. 16A–16C shows the structure and the fabrication steps of a probe sheet (structure) in a fifth embodiment of the present invention.

The fabrication method of this probe sheet is that, after the same steps as those shown in FIGS. 10A–10F, the step in FIG. 10G is not executed in which the elastomer 93 is formed in the area where the contact terminal part 8 is formed; instead, the steps shown in FIGS. 11A–11D are executed to fabricate a probe sheet structure in the state shown in FIG. 16A. After that, as shown in FIG. 16B, the adhesion layer 89 of the area where the contact terminal part 8 is formed and the part of the polyimide film 84 not covered by the wiring material 88 are removed by a laser. As a result, the contact terminal 4a is formed as a structure supported by both the wiring material 88 and the polyimide film 84.

FIG. 16C is a plan view, as viewed from the bottom of the probe sheet in FIG. 16B, showing a part of the area shown in FIG. 16B where the contact terminal part 8 is formed. Cutting off both sides of the contact terminal part 8 as shown in the figure allows the 'follow-mechanism' to be prepared for each contact terminal part 8.

FIG. 17 shows the structure and the fabrication method of a probe sheet (structure) in a sixth embodiment of the present invention.

Figure 17A:
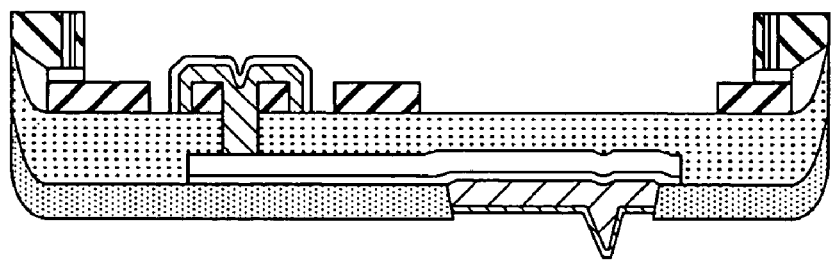
FIGS. 17A–17B are diagrams showing another fabrication process, in order of steps, for forming a probe sheet in a probe card of the present invention.
Figure 17B:
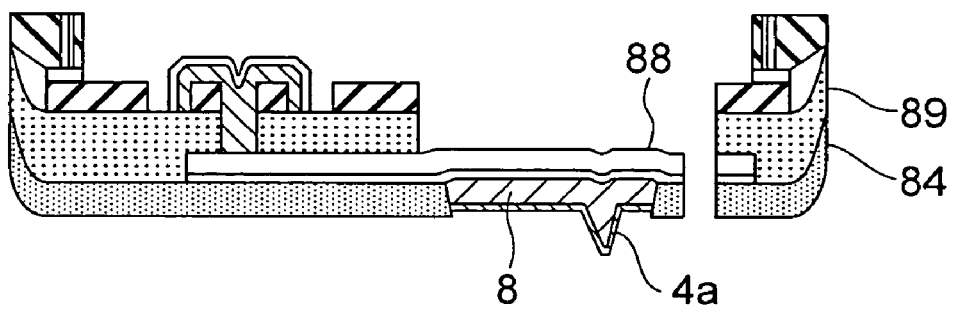
Figure 17C:
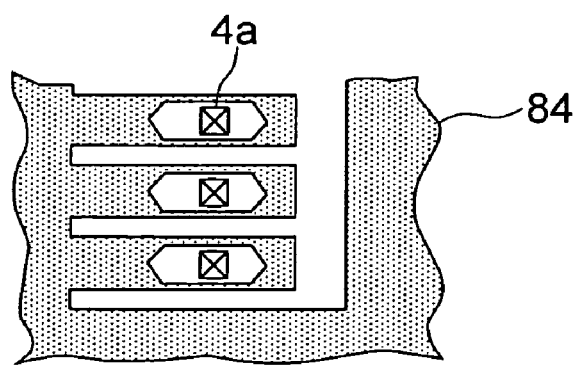
FIG. 17C is a plan view showing a part of the area of a contact terminal part 8 shown in FIG. 17B as viewed from the bottom.

The fabrication method of this probe sheet is that, after the same steps as those shown in FIGS. 10A–10F, the step in FIG. 10G is not executed in which the elastomer 93 is formed in the area where the contact terminal part 8 is formed; instead, the steps shown in FIGS. 11A–11D are executed to fabricate a probe sheet structure in the state shown in FIG. 17A. After that, as shown in FIG. 17B, the adhesion layer 89 of the area where the contact terminal part 8 is formed and the part of the polyimide film 84 not covered by the wiring material 88 are removed by a laser. As a result, the contact terminal 4a is formed as a structure supported by both the wiring material 88 and the polyimide film 84. FIG. 17C is a plan view, as viewed from the bottom of the probe sheet in FIG. 17B, showing a part of the area shown in FIG. 16B where the contact terminal part 8 is formed. Separating the contact terminal part 8 as shown in the figure allows each 'follow-mechanism' to move more easily than that in the fifth embodiment described above.

When a bonding wire is used as a lead line as shown in FIG. 6 or FIG. 8, the wiring may be wire bonded to the electrode 92. Instead, as shown in FIGS. 18A–18C, a plating layer 88a suitable for wire bonding may be formed on the wiring material to allow a wire to be wire bonded to the plating layer 88a to form a lead wire.

Figure 18A:
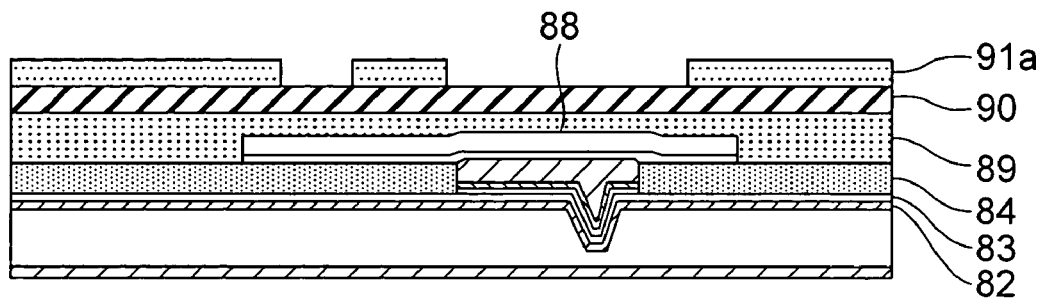
FIGS. 18A–18B are diagrams showing another fabrication process, in order of steps, for forming a probe sheet in a probe card of the present invention.
Figure 18B:
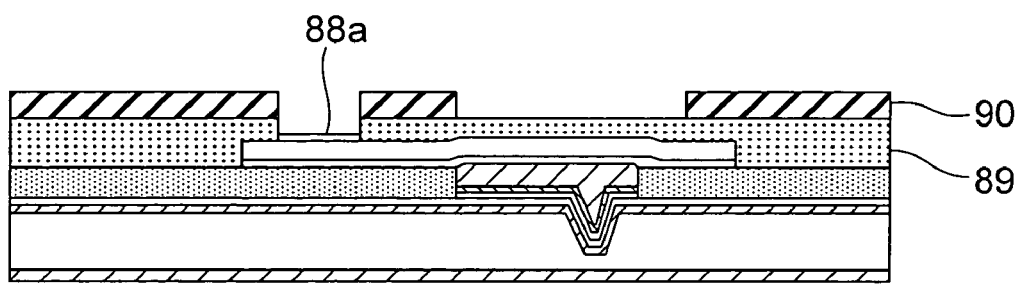
Figure 18C:
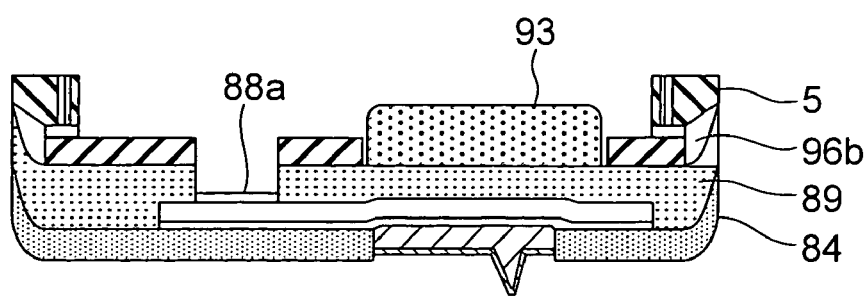
FIG. 18C is a schematic cross section diagram showing the probe sheet.

FIG. 18A shows a step in which a photo-resist mask 91a is formed on the metallic film 90 by the same steps as those in FIGS. 10A–10E. FIG. 18B shows a step in which a plating layer 88a for wire bonding is formed on the surface of the wiring material 88, with the etched metallic film 90 as the mask, by removing the adhesion layer 89 with a laser until the wiring material 88 is reached. The plating layer 88a is, for example, a nickel-plated plating layer that is gold plated. After that, the steps in FIG. 10F and FIGS. 11A–11D are executed to fabricate the probe sheet structure shown in FIG. 18C.

Several forms of a probe sheet (structure) have been described above. Each probe sheet (structure) may, of course, be applied to any probe card described above.

Next, semiconductor test equipment using the probe card (probing apparatus) according to the present invention will be described with reference to FIG. 19.

Figure 19:
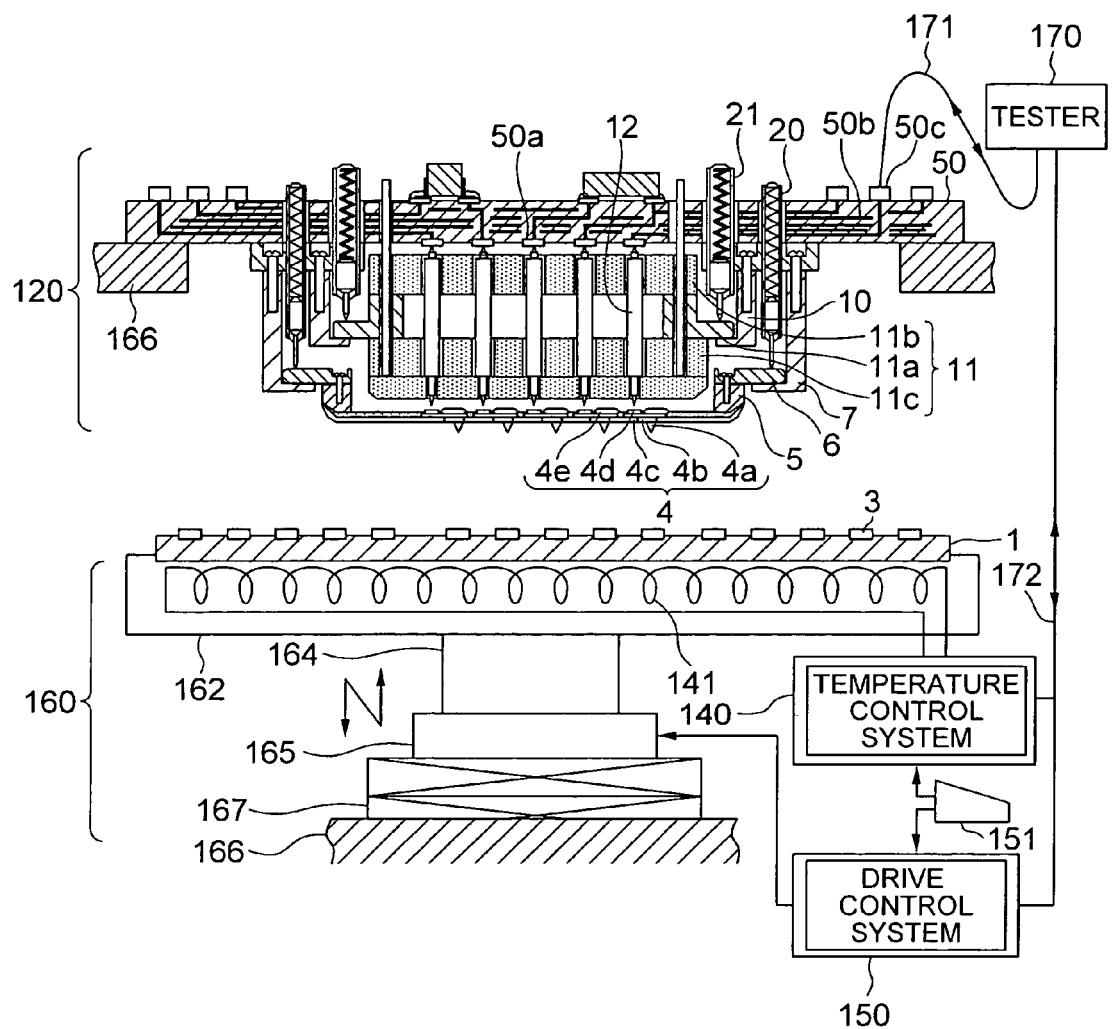
FIG. 19 is an overall configuration diagram showing one embodiment of a test system of the present invention.

FIG. 19 is a diagram showing the overall configuration of a test system including semiconductor test equipment according to the present invention.

In the overall configuration of the test system, the probe card is configured as a wafer prober. This test system comprises a sample holder system 160 that holds a semiconductor wafer 1 that is a test object; a probe card 120 that gets into contact with the electrodes 3 of the test object (wafer) 1 to send and receive electrical signals; a drive control system 150 that controls the operation of the sample holder system 160; a temperature control system 140 that controls the temperature of the test object 1; and a tester 170 that tests the electrical characteristics of a semiconductor device (chip) 2. On the semiconductor wafer 1, many semiconductor devices (chips) are arranged and, on the surface of each semiconductor device, a plurality of electrodes 3 are arranged as external connection electrodes. The sample holder system 160 comprises a stage 162 on which the semiconductor wafer 1 is removably set and which is set up almost horizontally; an elevating axis 164 set up vertically to support the stage 162; an elevation drive unit 165 that drives the elevation of the elevating axis 164; and an X-Y stage 167 that supports the elevation drive unit 165. The X-Y stage 167 is fixed on a body 166. The elevation drive unit 165 comprises, for example, a stepping motor. The positioning operation of the stage 162 in the horizontal and vertical directions is performed by combining the movement operation of the X-Y stage 167 in the horizontal plane and the vertical movement of the elevation drive unit 165. The stage 162 has a turning mechanism, not shown, to turn the stage 162 in the horizontal plane.

Above the stage 162 is provided the probe system 120. That is, the probe card 120 and the multi-layer wiring substrate 50 shown in FIG. 2 are opposed to the stage 162 in parallel. Each contact terminal 4a is connected to the electrode 50c on the multi-layer wiring substrate 50 via the pitch extension wiring 4c, electrode 4d, and spring probe 12 on the probe sheet 4 on the probe card 120 and via the electrode 50a and the internal wiring 50b on the multi-layer wiring substrate 50 and is connected to the tester 170 via a cable 171 connected to the electrode 50c.

To prevent a positional misalignment caused by a difference in temperature between the wafer heated by a heater to a desired temperature and the probe sheet on which the contact terminals, connected to the electrodes on the wafer for electrical signal testing, are formed and to adjust the alignment precisely and quickly, a temperature-controllable heating element may be formed in advance on the surface, or in the inside, of the probe sheet or the probe card. The heating element may be created, for example, by forming a high-resistance metallic material, such as Ni—Cr, or a high-resistance conductive resin directly on the probe sheet or the multi-layer wiring substrate layer or by inserting a sheet, on which the material is formed, into the probe sheet or pasting the sheet on the probe card. In addition, heated liquid may be poured into the tube in the heat block, which is then brought into contact with the probe card for use as the heating element.

Unlike the conventional method in which the temperature of a probe card is determined by heat emission from a heated wafer and the contact at the probing time, keeping the test-time temperature of a probe sheet independently as described above prevents a test-time temperature difference between the wafer and the probing sheet, making positional precision probing more accurate.

The drive control system 150 is connected to the tester 170 via a cable 172. The drive control system 150 sends control signals to the actuator of the drive units in the sample holder system 160 to control the operation. That is, the drive control system 150, which contains a computer, controls the operation of the sample holder system 160 according to the test operation progress information on the tester 170 transmitted via the cable 172. The drive control system 150, which comprises an operation unit 151, accepts various drive control instructions, for example, accepts manual operation instructions.

The stage 162 comprises a heater 141 that heats the semiconductor device 2. The temperature control system 140 controls the heater 141 in the stage 162 or a cooling jig to control the temperature of the semiconductor wafer 1 mounted on the stage 162. The temperature control system 140, which comprises the operation unit 151, accepts various temperature control instructions, for example, accepts manual operation instructions. In this case, the temperature-controllable heating element included in a part of the probe sheet or the probe card may be engaged with the heater 141 of the stage 162 to control the temperature.

The operation of the semiconductor test equipment will be described below. First, the semiconductor wafer 1 to be tested is positioned and mounted on the stage 162, and the X-Y stage 167 and the turning mechanism are driven to position the electrodes 3, formed on a plurality of semiconductor devices arranged on the semiconductor wafer 1, right below many contact terminals 4 arranged on the probe card 120. After that, the drive control system 150 activates the elevation drive unit 165 to elevate the stage 162 until the whole surface of many electrodes (contact target) 3 is brought up about 60 μm above the point at which it gets into contact with the tips of the contact terminals. This pushes out the region 4a, where many contact terminals 4 are arranged in the multi-layer film 6, and moves, in parallel, the precisely flattened tips of the many contact terminals 4 with the use of the compliance mechanism (pressure mechanism) so that the tips follow the surface of many electrodes 3 (whole) arranged on the semiconductor device. As a result, the contact terminals are pushed under an even load (about 3–150 mN per pin) so that the contact terminals follow the contact target (electrodes) 3 arranged on the semiconductor wafer 1, and the contact terminals 4 and the electrodes 3 are connected under a low resistance ($0.01\Omega$–$0.1\Omega$).

In addition, the operation power, operation test signals, and so on are sent and received between the semiconductor devices formed on the semiconductor wafer 1 and the tester 170 via the cable 171, wiring substrate 50, and contact terminals 4 to check the operation characteristics of the semiconductor devices. In addition, the sequence of test operations described above is performed for each semiconductor device formed on the semiconductor wafer 1 to check if the operation characteristics are good.

Next, an example of a test method using the semiconductor test equipment described above will be described with reference to FIG. 20.

Figure 20:
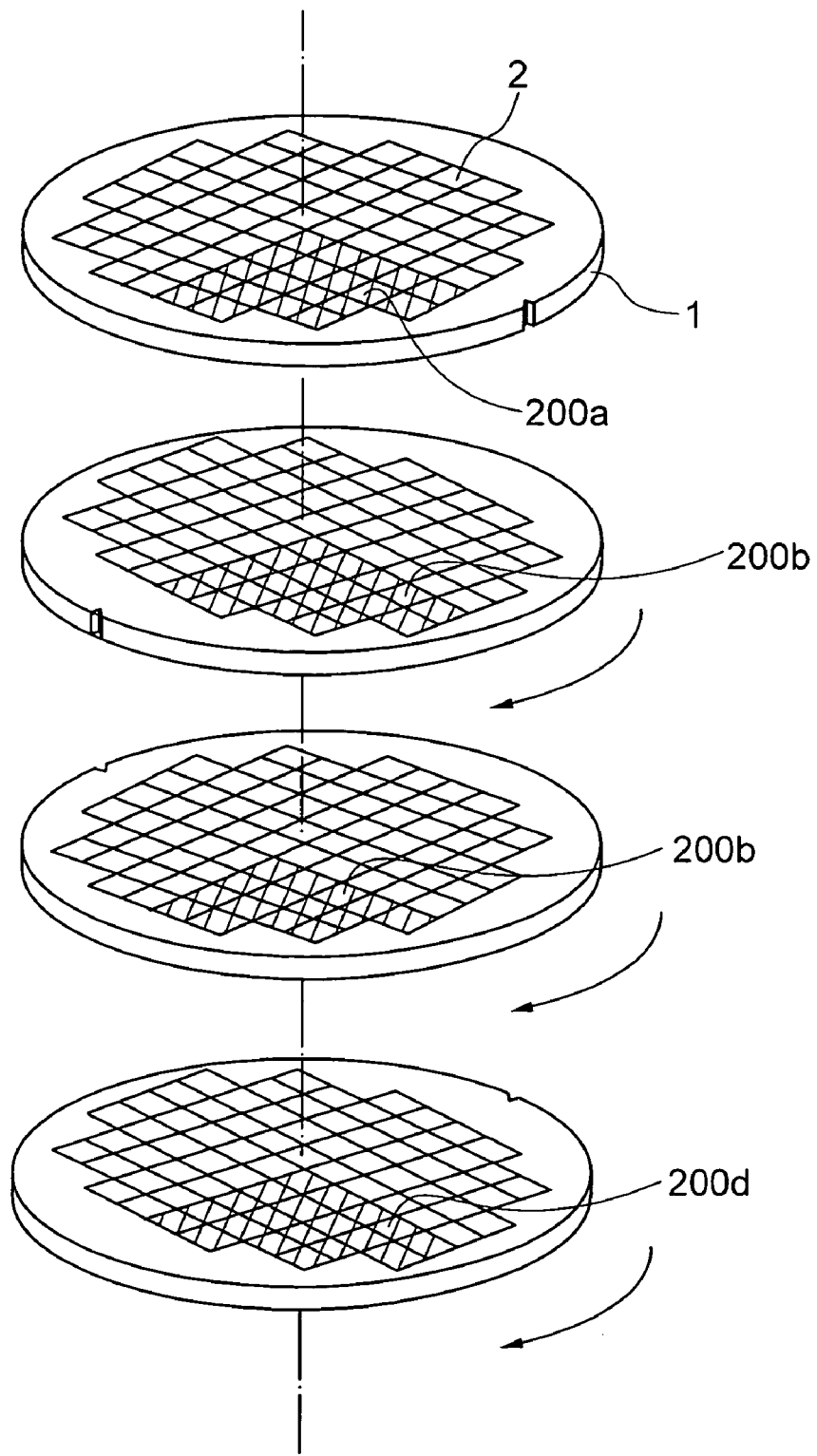
FIG. 20 is a diagram showing one embodiment of a test method using semiconductor devices.

The wafer holder is rotated, 90° at a time, to sequentially test simultaneous test chips 200a, 200b, 200c, and 200d as shown in FIG. 20. The whole wafer is tested in four 90° rotations. This allows all chips to be tested in the minimum touchdown count, thus increasing test efficiency. It is easily understood that the rotation may be made any angles other than 90°.

The probe sheet according to the present invention allows the layout pattern of contact terminals to be designed flexibly and to be formed at a time according to the whole layout of the semiconductor devices (chips) on a wafer to be tested. Therefore, efficient test equipment may be designed and configured that minimizes overlapped probing chip areas at each touchdown movement time, that allows an efficient movement pattern to be selected, and that reduces the touchdown count.

Thus, if a probe sheet used in the semiconductor test equipment is designed as described above according to the whole layout of the semiconductor devices formed on a wafer to be tested when the test method shown in FIG. 20 is used, there is no area where overlapped probing is performed on the chip pads. This minimizes the probing traces on the pads on the wafer and increases reliability in the later formation of wire bonds and bumps. In addition, because the contact terminals on the probe sheet does not created in an area where no chip is formed, the contact terminals do not hit against the end of the silicon wafer and therefore prevents damage to the contact terminals.

Finally, a semiconductor device fabrication method, including the test process or the test method using the semiconductor test equipment described above, will be described with reference to FIG. 21.

A semiconductor device fabrication method according to the present invention comprises the steps of creating circuits on a wafer to form semiconductor devices; testing the electrical characteristics of a plurality of semiconductor devices 2 at a time on a wafer level using the semiconductor test equipment according to the present invention; dicing the wafer into semiconductor devices; and sealing the semiconductor devices with resin and so on.

Another semiconductor device fabrication method according to the present invention comprises the steps of creating circuits on a wafer to form semiconductor devices; testing the electrical characteristics of a plurality of semiconductor devices 2 at a time on a wafer level using the semiconductor test equipment according to the present invention; and dicing the wafer into semiconductor devices.

A still another semiconductor device fabrication method according to the present invention comprises the steps of creating circuits on a wafer to form semiconductor devices; sealing the wafer with resin and so on; and testing the electrical characteristics of a plurality of semiconductor devices 2, formed on the sealed wafer, at a time using the semiconductor test equipment according to the present invention.

A still another semiconductor device fabrication method according to the present invention comprises the steps of creating circuits on a wafer to form semiconductor devices; sealing the wafer with resin and so on; testing the electrical characteristics of a plurality of semiconductor devices 2, formed on the sealed wafer, at a time using the semiconductor test equipment according to the present invention; and dicing the wafer into semiconductor devices.

Referring to FIGS. 22A–22B to FIGS. 25A–25B, the features and effects of the semiconductor device itself will be described more in detail.

Figure 22A:
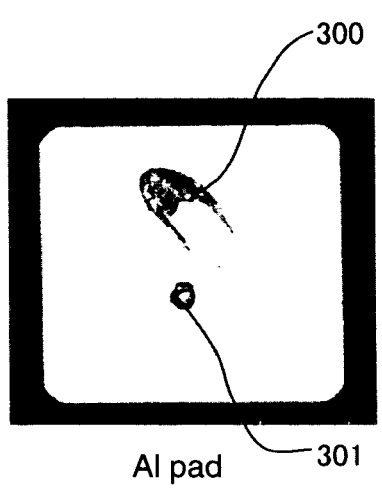
FIGS. 22A–22B are top views showing indentations left on an electrode pad during a test process.
Figure 22B:
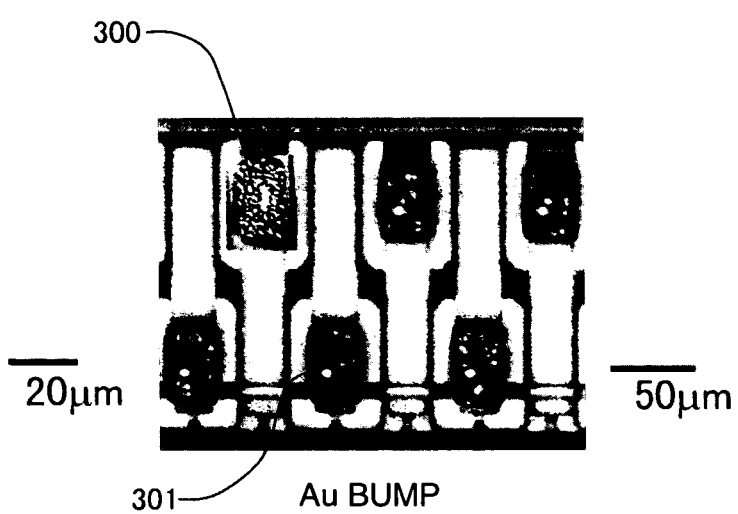

FIGS. 22A–22B show the top view of the trace of an indentation (probing indentation) left on an electrode pad during a test process. In FIGS. 22A–22B, for easy comparison between an indentation 300 left by a conventional cantilever probe and an indentation 301 left by contact terminals disclosed in this application, both indentations are combined and shown side by side on the same electrode. Of course, the scaling is not changed.

When a semiconductor device is tested using a conventional cantilever prober or a prober whose insulating film has a hemispheric or trapezoidal plated bump formed thereon, the scrub operation is performed with a load applied from the contact terminal during probing. Therefore, electrode waste is generated on the electrode pad and a large indentation 300 is left. In addition, there is a worry that the device right below the electrode pad is damaged. When a plurality of test processes are executed for the electrode pad as shown in FIG. 21, a plurality of indentations are generated and this defect becomes even more obvious.

That is, the surface of the electrode pad of a semiconductor device tested using a conventional probe becomes rough and, as a result, a connection problem may develop in the bonding/mounting process (wire bonding, gold bump connection, solder bump connection, Au—Sn connection, and so on) that is performed after the test process.

Figure 23A:
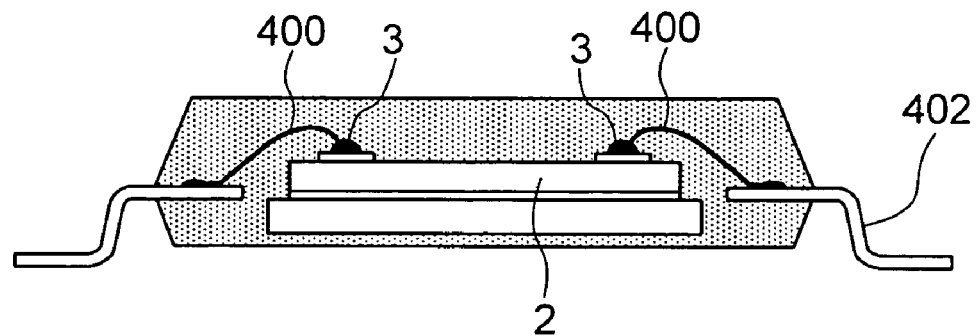
FIGS. 23A–23C are schematic cross section diagrams showing typical examples of semiconductor devices packaged or bump-formed after a test process.
Figure 23B:
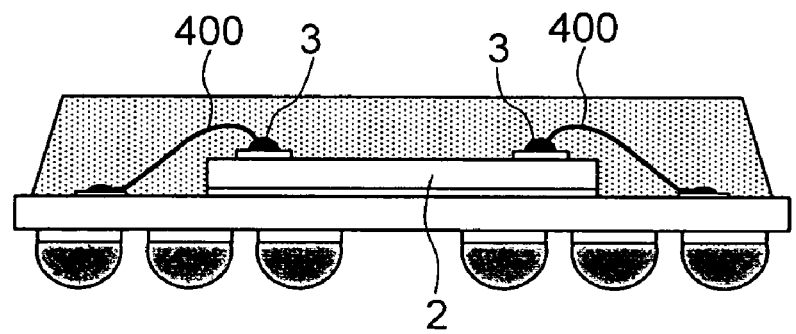
Figure 23C:
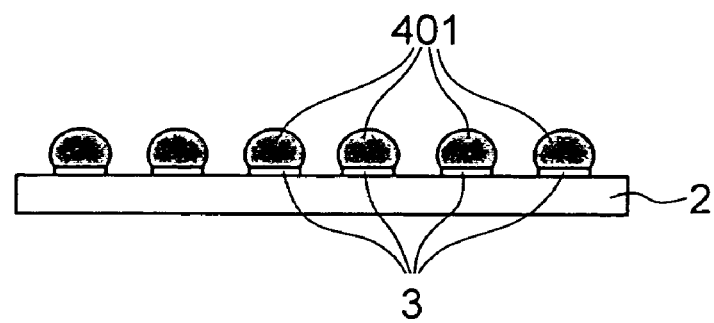

For example, for a QFP (Quad Flat Package) shown in FIG. 23A or a BGA (Ball Grid Array Package) shown in FIG. 23B, a connection problem will develop at the connection between a wire 400 connected to a lead 402 and an electrode pad 3; for a flip-chip package shown in FIG. 23C, a connection problem will develop at the connection between a solder bump 401 and an electrode pad 3.

Figure 24A:
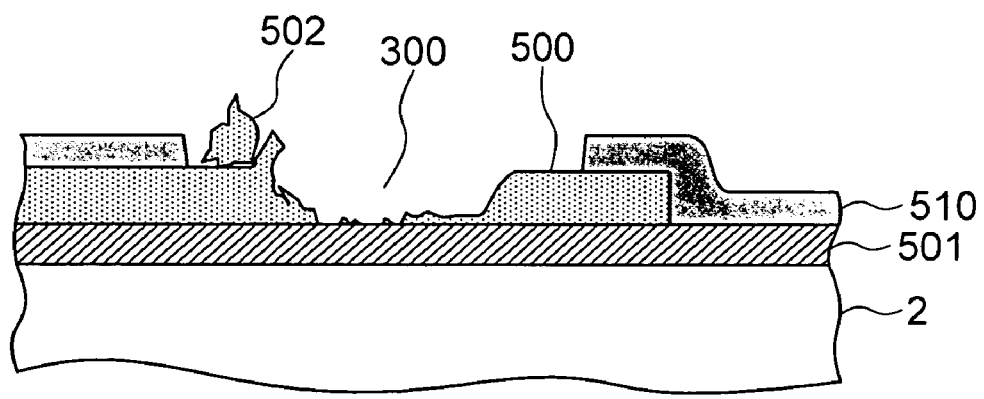
FIG. 24A is a schematic cross section diagram showing an electrode pad on a semiconductor device tested using a conventional prober.
Figure 24B:
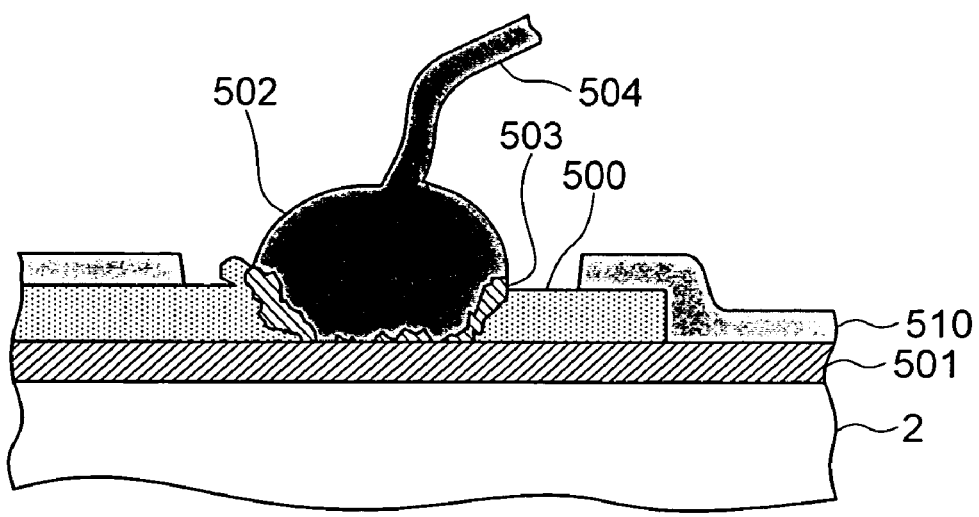
FIG. 24B is a schematic cross section diagram showing the electrode pad after it is wire bonded to the tested semiconductor device.

This problem will be described more in detail with reference to FIGS. 24A–24B. FIG. 24A is a general cross section diagram showing an electrode pad 3 exposed from a protective film 510 after a test using a conventional prober. Because the scrub operation was executed, the electrode surface is rough and electrode waste 502 is present. Because the surface was scrubbed under a heavy load, a part of an aluminum layer 500 becomes extremely thin or is chipped off with the result that a part of a base film 501 (for example, SiO2) is exposed.

Normally, when wire bonding to an electrode pad on the aluminum layer is performed using a gold wire 504, an alloy 503 of gold 505 and aluminum 500 is formed in the connection boundary for better connection. However, the electrode pad shown in FIG. 24A does not form a good alloy but will result in a bad connection.

By contrast, because only a low load is applied to, but no scrub operation is performed for, a semiconductor device tested by contact terminals disclosed in this application, almost no electrode waste is generated on the electrode pad 500 and almost no damage is given to a device right under the electrode pad. In addition, the probing indentation 301 is very small, about 5 μm square, because the indentation is a hole with the shape of the tip of an edged contact terminal that is a pyramid-shaped or truncated-pyramid-shaped contact terminal. For the electrode area except the indentation with a polygon opening such as a square or rectangular opening (one side is at most 20 μm or shorter; the side may be 15 μm, 10 μm, 1 μm, or even shorter), the surface remains flat and the electrode surface remains clean even after a plurality of probing operations. That is, because the electrode surface has many flat parts but no peeled-off parts, an alloy can be formed on the bonding part more easily than in the conventional method during the bonding/mounting process that is performed after the test process and therefore good connection is established.

Figure 25A:
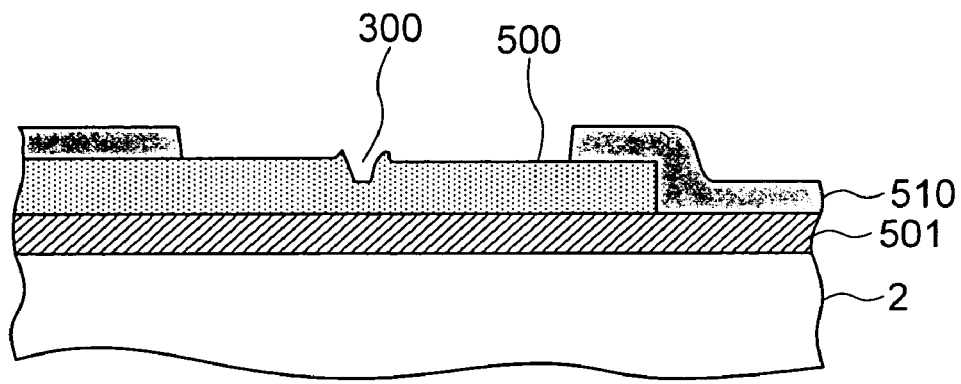
FIG. 25A is a schematic cross section diagram showing an electrode pad on a semiconductor device after it is tested using a contact terminal disclosed in this application.
Figure 25B:
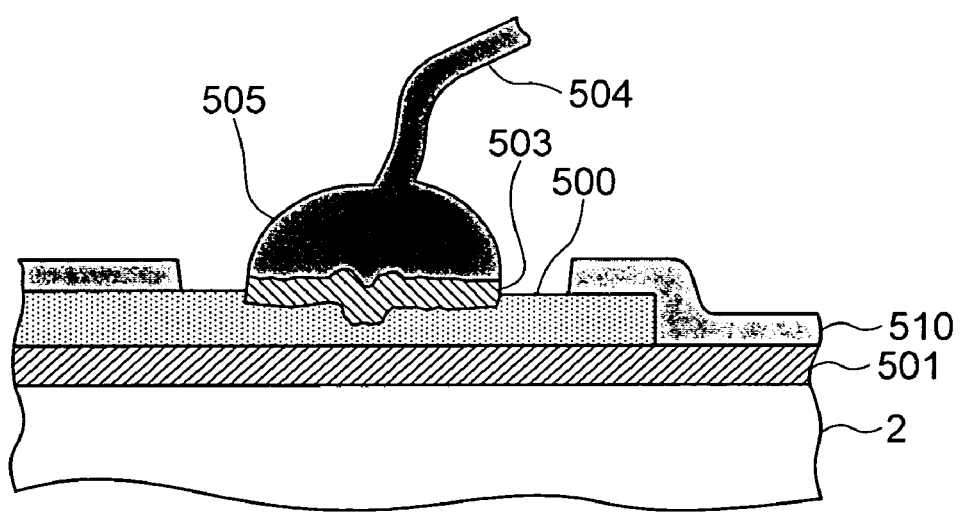
FIG. 25B is a schematic cross section diagram showing the electrode pad after it is wire bonded to the tested semiconductor device.

This is described more in detail with reference to FIGS. 25A–25B. Because, the pyramid-shaped or truncated-pyramid-shaped contact terminal leaves a small indentation 301 on, and applies a low load to, the electrode pad 3 tested using the contact terminal disclosed in this application, the electrode pad 3 remains in good state in which no part of the base film 501 is exposed.

When wire bonding is performed in this state, the alloy layer 503 is formed almost all over, a good connection is established, and no connection problem is generated.

Therefore, reliable semiconductor devices are fabricated and the yield ratio is improved.

Although examples of an electrode pad and a gold wire bond whose top layer is aluminum are shown in FIGS. 24A–24B and FIGS. 25A–25B, the material may be changed. The same effect may be achieved not only in the wire bonding process but also in other bonding/mounting processes.

Although the invention has been described with reference to the preferred embodiments thereof, it will be understood that the present invention is not limited to those embodiments but may be changed without departing from the spirit of the invention.

For example, the elastomer 93 may be formed in a way other than that described above. For example, the elastomer may be formed by applying a photosensitive resin or a photosensitive elastic resin with a spinner and then exposing and developing the resin using a mask, or by printing an elastic resin on a dry film, from which the part corresponding to the elastomer has been removed, and then, after polishing the surface as needed, removing the dry film.

The representative aspects disclosed in the above embodiments are as follows:

(1) A probe sheet comprising contact terminals that get into contact with electrodes provided on a wafer; wirings drawn from the contact terminals; and electrode pads electrically connected to the wirings, wherein a pitch of the electrode pads is wider than a pitch of the contact terminals.

(2) A probe sheet comprising contact terminals arranged according to an array of peripheral electrodes of semiconductor devices formed on a wafer; wires drawn from the contact terminals; and electrode pads electrically connected to the wires, wherein the electrode pads are arranged in a grid pattern.

(3) A probe sheet comprising contact terminals that get into contact with electrodes provided on a wafer; wires drawn from the contact terminals; and electrode pads electrically connected to the wires, wherein the probe sheet is provided with a metallic sheet from which at least a part corresponding to signal electrode pads of the electrode pads is removed.

(4) The probe sheet as described in (3) wherein the linear expansion coefficient of the metallic sheet is almost equal to the linear expansion coefficient of the wafer.

(5) The probe sheet as described in (3) or (4) wherein the metallic sheet is a 42 alloy sheet.

(6) The probe sheet as described in one of (1)–(5) wherein dummy terminals, each of which has a larger contact area with the wafer than the contact terminal, are provided on a surface on which the contact terminals are provided.

(7) The probe sheet as described in one of (1)–(6) wherein the contact terminals are created each by using an anisotropically etched hole in a crystalline substrate as a cast.

(8) A probe card comprising a probe sheet having contact terminals that get into contact with electrodes provided on a wafer; and a multi-layer wiring substrate on which electrodes, which are electrically connected to the contact terminals, are provided on a surface opposed to the wafer, wherein a pitch of the electrodes provided on the surface of the multi-layer wiring substrate opposed to the wafer is wider than a pitch of the contact terminals.

(9) A probe card comprising a probe sheet on which contact terminals arranged according to an array of peripheral electrodes of semiconductor devices formed on a wafer; and a multi-layer wiring substrate having electrodes provided on a surface opposed to the wafer, the electrodes being electrically connected to the contact terminals, wherein the electrodes provided on the surface of the multi-layer wiring substrate opposed to the wafer are arranged in a grid pattern.

(10) A probe card comprising contact terminals that get in contact with electrodes provided on a wafer; and a multi-layer wiring substrate having electrodes electrically connected to the contact terminals, wherein the electrodes of the multi-layer wiring substrate are provided in a device-opposed-area on the multi-layer wiring substrate and a pitch of the electrodes is wider than a pitch of the contact terminals.

(11) A probe card as described in one of (8) to (10) wherein at least one of capacitors, resistors, or fuses are mounted in the device-opposed area on the multi-layer wiring substrate.

(12) A probe card comprising a probe sheet having contact terminals that get in contact with electrodes on a wafer; and a multi-layer wiring substrate having electrodes electrically connected to the contact terminals wherein the electrodes of the contact terminals and the electrodes of the multi-layer wiring substrate are electrically connected by a connection part provided almost vertically with respect the multi-layer wiring substrate.

(13) A probe card comprising a probe sheet having contact terminals that get in contact with electrodes provided on a wafer; and a multi-layer wiring substrate having electrodes electrically connected to the contact terminals wherein a connection between the electrodes of the contact terminals and the electrodes of the multi-layer wiring substrate is made via wires drawn from the contact terminals, electrode pads connected to the wires and having a pitch wider than a pitch of the contact terminals, and spring probes electrically connected to the electrode pads.

(14) The probe card as described in (13) wherein the spring probes are removable.

(15) A probe card comprising a probe sheet having contact terminals that get in contact with electrodes provided on a wafer; and a multi-layer wiring substrate having electrodes electrically connected to the contact terminals wherein a connection between the electrodes of the contact terminals and the electrodes of the multi-layer wiring substrate is made via wirings drawn from the contact terminals, electrode pads connected to the wirings and having a pitch wider than a pitch of the contact terminals, and wires electrically connected to the electrode pads.

(16) A probe card comprising contact terminals that get in contact with electrodes provided on a wafer; and a multi-layer wiring substrate having electrodes electrically connected to the contact terminals wherein the probe card has a temperature adjustment function.

(17) A probe card comprising contact terminals that get in contact with electrodes provided on a wafer; and a multi-layer wiring substrate having electrodes electrically connected to the contact terminals wherein a heating element capable of controlling a temperature is provided at least in a part of the probe card.

(18) The probe card as described in one of (8)–(17) wherein the contact terminals are each a pyramid-shaped or truncated-pyramid-shaped terminal created with an anisotropically etched hole in a crystalline substrate as a shape former.

(19) A probe card comprising contact terminals that get in contact with electrodes provided on a wafer; and a multi-layer wiring substrate having electrodes electrically connected to the contact terminals wherein the probe card has a two-level pressure mechanism.

(20) A probe card comprising a probe sheet having contact terminals that get in contact with electrodes provided on a wafer; and a multi-layer wiring substrate having electrodes electrically connected to the contact terminals wherein the probe sheet is the probe sheet described in one of (1)–(7).

(21) Semiconductor test equipment comprising a stage on which a wafer is mounted; and a probe card having contact terminals that get in contact with electrodes of semiconductor devices formed on the wafer and electrically connected to a tester that tests electrical characteristics of the semiconductor devices wherein the probe card comprises a probe sheet having the contact terminals and a multi-layer wiring substrate whose electrodes electrically connected to the contact terminals are provided on a surface opposed to the wafer and wherein a pitch of the electrodes of the multi-layer wiring substrate provided on the surface opposed to the wafer is wider than a pitch of the contact terminals.

(22) Semiconductor test equipment comprising a stage on which a wafer is mounted; and a probe card having contact terminals that get in contact with electrodes of semiconductor devices formed on the wafer and electrically connected to a tester that tests electrical characteristics of the semiconductor devices wherein a temperature of the stage and the probe card can both be controlled.

(23) The semiconductor test equipment as described in (21) or (22) wherein the contact terminals are each a pyramid-shaped or truncated-pyramid-shaped terminal created with an anisotropically etched hole in a crystalline substrate as a shape former.

(24) The semiconductor test equipment comprising a stage on which a wafer is mounted; and a probe card having contact terminals that get in contact with electrodes provided on the wafer wherein the probe card is one of the probe cards described in (8) to (20).

(25) A semiconductor device fabrication method comprising the steps of creating circuits on a wafer to form semiconductor devices; testing electrical characteristics of the semiconductor devices; and dicing the wafer into semiconductor devices wherein, in the step of testing electrical characteristics of the semiconductor devices, a plurality of semiconductor devices are tested at a time using a probe card comprising a probe sheet having contact terminals that get in contact with electrodes of the semiconductor devices and a multi-layer wiring substrate electrically connected to the contact terminals and having electrodes, whose pitch is wider than a pitch of the contact terminals, on a surface opposed to the wafer.

(26) A semiconductor device fabrication method comprising the steps of creating circuits on a wafer to form semiconductor devices; testing electrical characteristics of the semiconductor devices; and dicing the wafer into semiconductor devices wherein, in the step of testing electrical characteristics of the semiconductor devices, a plurality of semiconductor devices are tested at a time using a probe card comprising contact terminals that get in contact with electrodes provided on the wafer and a multi-layer wiring substrate electrically connected to the contact terminals, provided in an area corresponding to an upper part of the semiconductor devices formed on the wafer, and having electrodes whose pitch is wider than a pitch of the contact terminals.

(27) A semiconductor device fabrication method comprising the steps of creating circuits on a wafer to form semiconductor devices; sealing the wafer with resin; and testing electrical characteristics of the semiconductor devices formed on the sealed wafer wherein, in the step of testing electrical characteristics of the semiconductor devices, a plurality of semiconductor devices are tested at a time using a probe card comprising a probe sheet having contact terminals that get into contact with electrodes of the semiconductor devices and a multi-layer wiring substrate electrically connected to the contact terminals and having electrodes, whose pitch is wider than a pitch of the contact terminals, on a surface opposed to the wafer.

(28) A semiconductor device fabrication method comprising the steps of creating circuits on a wafer to form semiconductor devices; sealing the wafer with resin; and testing electrical characteristics of the semiconductor devices formed on the sealed wafer wherein, in the step of testing electrical characteristics of the semiconductor devices, a plurality of semiconductor devices are tested at a time using a probe card comprising contact terminals that get in contact with electrodes provided on the wafer and a multi-layer wiring substrate electrically connected to the contact terminals, provided in an area corresponding to an upper part of the semiconductor devices formed on the wafer, and having electrodes whose pitch is wider than a pitch of the contact terminals.

(29) The semiconductor device fabrication method as described in one of (25)–(28) wherein the contact terminals are each a pyramid-shaped or truncated-pyramid-shaped terminal created with an anisotropically etched hole in a crystalline substrate as a shape former. p0 (30) A semiconductor device fabrication method comprising the steps of creating circuits on a wafer to form semiconductor devices; testing electrical characteristics of the semiconductor devices; and dicing the wafer into semiconductor devices wherein, in the step of testing electrical characteristics of the semiconductor devices, the wafer is rotated for testing.

The effect achieved by the representative inventions disclosed in this application is described briefly below.

(1) A probe card is provided that can test a plurality of semiconductor devices, with a narrow-pitch electrode structure, at a time.

(2) A semiconductor device fabrication method is provided that lowers the fabrication cost of the whole semiconductor devices and increases the throughput.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A probe sheet comprising:
   contact terminals arranged in a first surface of the probe sheet to oppose a wafer part to contact with electrodes provided on the wafer part;
   wirings, each being drawn from one of the contact terminals in the probe sheet; and
   electrode pads, each being arranged in a second surface of the probe sheet at an opposite side thereof to the first surface and electrically connected to one of the wirings,
   wherein a pitch between each adjacent electrode pads of the electrode pads in the second surface of the probe sheet is wider than a pitch between each corresponding adjacent contact terminals of the contact terminals in the first surface thereof, and
   wherein each of the contact terminals is supported by polymide.

2. A probe sheet according to claim 1,
   wherein the contact terminals are arranged according to an array of peripheral electrodes of semiconductor devices formed on the wafer part, and
   wherein the electrode pads are arranged in a grid pattern.

3. A probe sheet according to claim 1,
   wherein a metallic sheet, from which at least a part corresponding to signal electrode pads of the electrode pads is removed, is provided on the second surface of the probe sheet.

4. A probe sheet according to claim 3,
   wherein a linear expansion coefficient of the metallic sheet is equal to a linear expansion coefficient of the wafer part.

5. A probe sheet according to claim 3,
   wherein the metallic sheet is a 42 alloy sheet.

6. A probe sheet according to claim 1,
   wherein dummy terminals, each of which has a larger contact area with the wafer part than that of each of the contact terminals, are provided on the first surface of the probe sheet on which the contact terminals are provided.

7. A probe sheet according to claim 1,
   wherein the contact terminals are each created by using an anisotropically etched hole in a crystalline substrate as a cast.

8. A probe card comprising:
   a probe sheet having contact terminals being arranged in a first surface of the probe sheet to oppose a wafer part to contact with electrodes provided on the wafer part, wirings each being drawn from one of the contact terminals, and electrode pads each being arranged in a second surface of the probe sheet at an opposite side thereof to the first surface and electrically connected to one of the wirings; and
   a multi-layer wiring substrate being provided at an opposite side of the probe sheet to the wafer part to face the second surface thereof, the multi-layer wiring substrate has electrodes each being electrically connected to one of the contact terminals through the one of the electrode pads and formed on a surface of the multi-layer wiring substrate, and
   wherein a pitch between each adjacent electrode pads of the electrode pads in the second surface of the probe sheet is wider than a pitch between each corresponding adjacent contact terminals of the contact terminals in the first surface thereof, and
   wherein each of the contact terminals are supported by polyimide.

9. A probe card according to claim 8,
   wherein the contact terminals of the probe sheet are arranged according to an array of peripheral electrodes of semiconductor devices formed on the surface of the wafer part, and
   wherein the electrodes of the multi-layer wiring substrate are arranged in a grid pattern in the surface thereof.

10. A probe card according to claim 8,
    wherein the electrodes of the multi-layer wiring substrate are provided in a device-opposed-area on the surface of the multi-layer wiring substrate.

11. A probe card according to claim 10,
    wherein the device-opposed atea is an atea of the multi-layer wiring substrate opposite to semiconductor devices formed on the surface of the wafer part across the probe sheet.

12. A probe card according to claim 8,
    wherein at least one of capacitors, resistors or fuses are mounted in a device-opposed area on the multi-layer wiring substrate.

13. A probe card according to claim 12,
    wherein the device-opposed area is an area of the multi-layer wiring substrate opposite to semiconductor devices formed on the surface of the wafer part across the probe sheet, and that at least one of capacitors, resistors or fuses are mounted on a surface of the multi-layer wiring substrate at an opposite side thereof to the wafer part.

14. A probe card according to claim 8,
wherein the electrode pads arranged in the second surface of the probe sheet and the electrodes of the multi-layer wiring substrate are electrically connected by a connection part extended vertically with respect the multi-layer wiring substrate.

15. A probe card according to claim 8,
wherein the electrodes of the multi-layer wiring substrate are electrically connected to the electrode pads arranged in the second surface of the probe sheet via spring probes disposed therebetween.

16. A probe card according to claim 15,
wherein the spring probes are removable.

17. A probe card according to claim 8,
wherein each of the electrodes of the multi-layer wiring substrate and each of the electrode pads arranged in the second surface of the probe sheet are electrically connected to each other via a wire extended therebetween.

18. A probe card according to claim 8,
wherein the probe card is provided with a heating element having a temperature adjustment function.

19. A probe card according to claim 8,
wherein the contact terminals are each a pyramid-shaped or truncated-pyramid-shaped terminal created by using an anisotropically etched hole in a crystalline substrate as a cast.

20. A semiconductor test equipment comprising:
a stage on which a wafer part is mounted; and
a probe card having contact terminals that get in contact with electrodes of semiconductor devices formed on the wafer part and electrically connected to a tester that tests electrical characteristics of the semiconductor devices,
wherein the probe card comprises:
 a probe sheet having the contact terminals being arranged in a first surface of the probe sheet opposite to the water part, wirings each being drawn from one of the contact terminals, and electrode pads each being arranged in a second surface of the probe sheet at an opposite side thereof to the first surface and electrically connection to one of the wirings; and
 a multi-layer wiring substrate whose electrodes electrically connected to the contact terminals via the electrode pads respectively are provided on a surface opposed to the wafer part across the probe sheet, and
wherein a pitch between each adjacent electrode pads of the electrode pads in the second surface of the probe sheet is wider than a pitch between each corresponding adjacent contact terminals of the contact terminals in the first surface thereof, and
wherein each of the contact terminals is supported by polyimide.

21. A semiconductor test equipment according to claim 20,
wherein a temperature of the stage is controlled by a heater being provided to the stage and a temperature of the probe card is controlled by a heating element being provided to the probe card.

22. A semiconductor test equipment according to claim 20,
wherein the contact terminals are each a pyramid-shaped or truncated-pyramid-shaped terminal created with an anisotropically etched hole in a crystalline substrate as a shape former.

23. A probe sheet comprising:
contact terminals arranged in a first surface of the probe sheet to oppose a wafer part to contact with electrodes provided on the wafer part;
wirings, each being drawn from one of the contact terminals in the probe sheet; and
electrode pads, each being arranged in a second surface of the probe sheet at an opposite side thereof to the first surface and electrically connected to one of the wirings,
wherein a pitch between each adjacent electrode pads of the electrode pads in the second surface of the probe sheet is wider than a pitch between each corresponding adjacent contact terminals of the contact terminals in the first surface thereof, and wherein ones of the electrode pads extending in a direction away from an area of the contact terminals are laid out in an array having at least three rows extending at least somewhat parallel to the area, and
wherein each of the contact terminals is supported by polyimide.

24. A probe sheet as claimed in claim 23, wherein the electrode pads of a subject row of the rows, are staggered with respect to the electrode pads of a neighboring row.

25. A probe sheet as claimed in claim 23, wherein the wirings are serpentine wirings, and ones of the serpentine wirings trace serpentine paths between the electrode pads.

26. A probe sheet as claimed in claim 25, wherein a pitch between ones of the serpentine wirings varies extending in the direction away from the area of the contact terminals.

* * * * *